(12) United States Patent
Yoshinaga et al.

(10) Patent No.: US 8,220,878 B2
(45) Date of Patent: Jul. 17, 2012

(54) ELECTRONIC DEVICE INCLUDING CIRCUIT BOARD WITH RADIATING MEMBER, HYDRAULIC UNIT INCLUDING THE ELECTRONIC DEVICE, AND METHOD OF FIXING THE RADIATING MEMBER TO THE CIRCUIT BOARD

(75) Inventors: Kumiko Yoshinaga, Ota (JP); Yuichi Yanagisawa, Maebashi (JP)

(73) Assignee: Hitachi, Ltd., Tokyo (JP)

( * ) Notice: Subject to any disclaimer, the term of this patent is extended or adjusted under 35 U.S.C. 154(b) by 603 days.

(21) Appl. No.: 12/411,967

(22) Filed: Mar. 26, 2009

(65) Prior Publication Data

US 2009/0241538 A1    Oct. 1, 2009

(30) Foreign Application Priority Data

Mar. 28, 2008   (JP) .................................. 2008-088753

(51) Int. Cl.
*H05K 7/20*         (2006.01)
(52) U.S. Cl. ...................... 303/119.3; 361/704; 361/710; 361/713
(58) Field of Classification Search ............... 303/116.4, 303/119.1–119.3; 361/704, 707, 709, 710, 361/713; 137/859–861
See application file for complete search history.

(56) References Cited

U.S. PATENT DOCUMENTS

| 5,870,286 | A | 2/1999 | Butterbaugh et al. |
| 5,957,547 | A * | 9/1999 | Schliebe et al. ........... 303/119.3 |
| 6,158,266 | A | 12/2000 | Elipe et al. |
| 6,301,113 | B1 * | 10/2001 | Guerrero ....................... 361/704 |
| 6,418,025 | B1 | 7/2002 | Lee |
| 6,634,723 | B1 * | 10/2003 | Ganzel et al. ............... 303/119.3 |
| 6,972,959 | B2 * | 12/2005 | Asai et al. ..................... 361/719 |
| 7,967,395 | B2 * | 6/2011 | Sakai .......................... 303/119.3 |
| 2005/0111192 | A1 * | 5/2005 | Lee et al. ..................... 361/704 |
| 2006/0272797 | A1 | 12/2006 | Ferber et al. |

FOREIGN PATENT DOCUMENTS

| DE | 197 50 433 A1 | 6/1999 |
| DE | 103 53 849 A1 | 6/2005 |
| JP | 11 01 7371 | 1/1999 |

OTHER PUBLICATIONS

German Office Action with English translation dated Jul. 11, 2010 (Fourteen (14) pages).

* cited by examiner

*Primary Examiner* — Christopher Schwartz
(74) *Attorney, Agent, or Firm* — Crowell & Moring LLP

(57) ABSTRACT

An electronic device including a circuit board onto which an electronic part is installed, a radiating member, and at least one fitting member that fixes the radiating member to the circuit board, the fitting member being formed with a resilient portion that is configured to produce a resilient restoring force and holds the radiating member in a state fixed to the circuit board by the resilient restoring force.

16 Claims, 21 Drawing Sheets

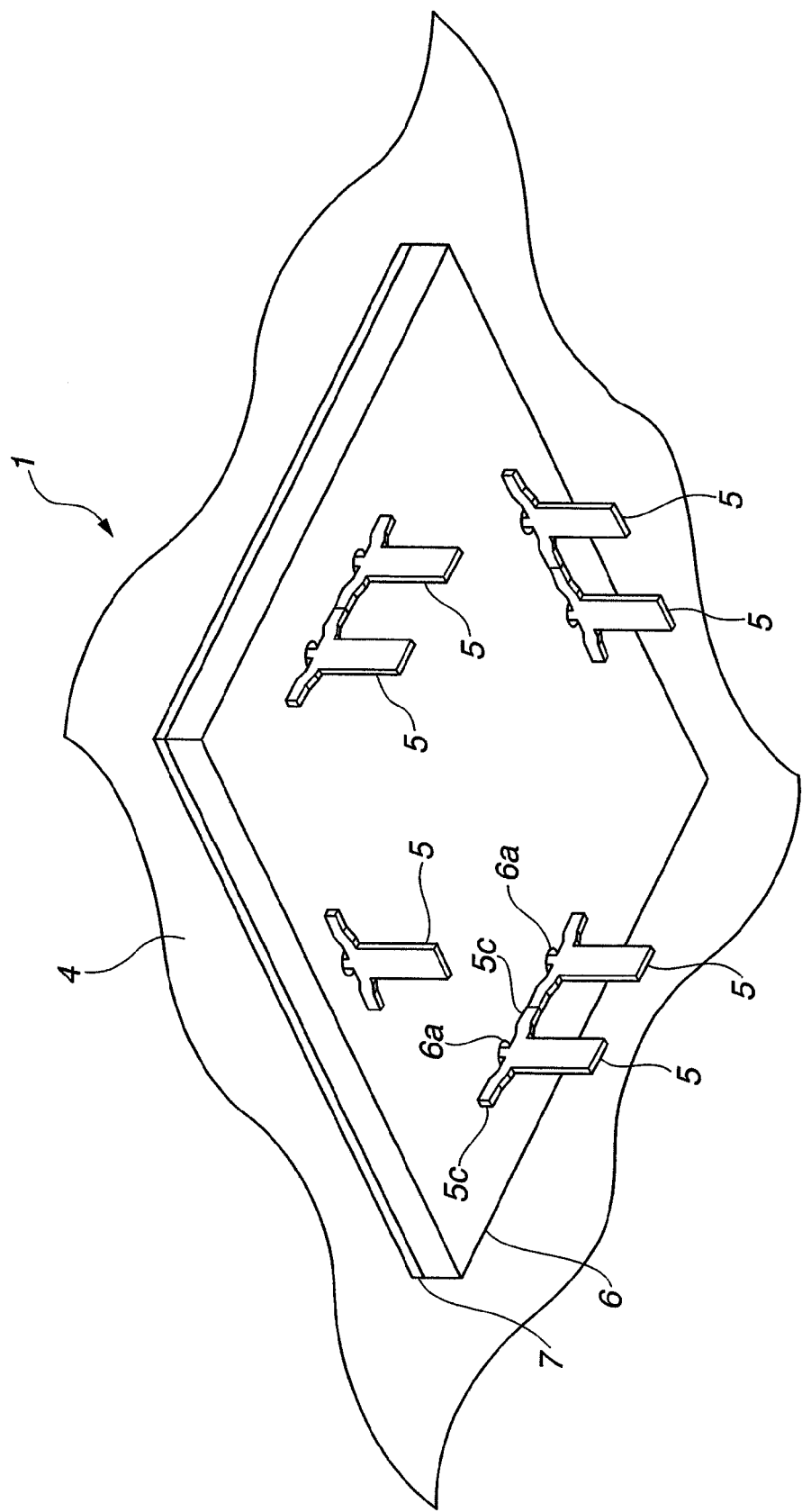

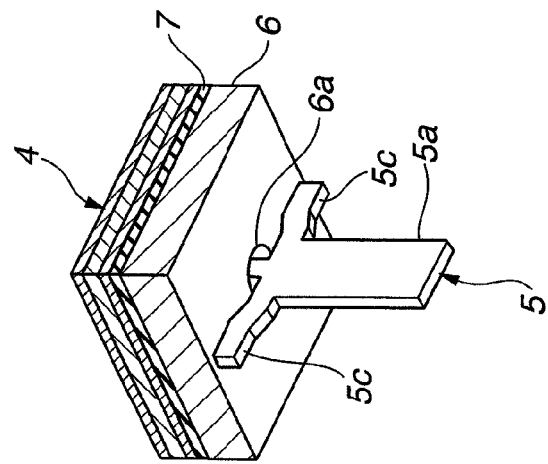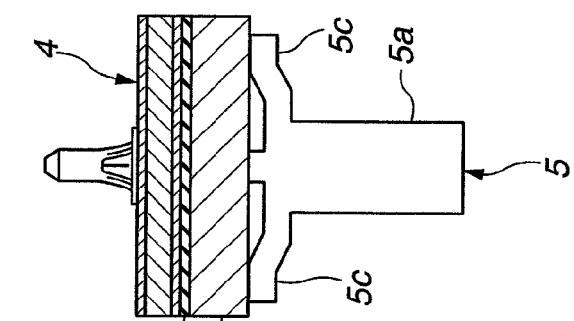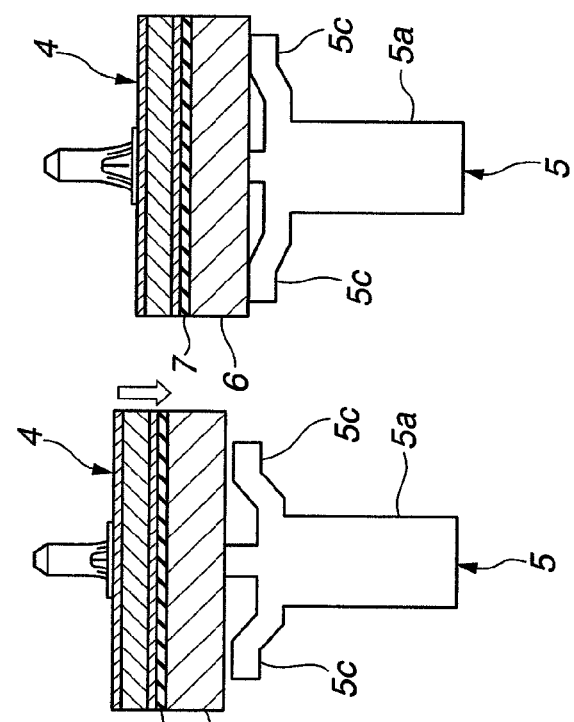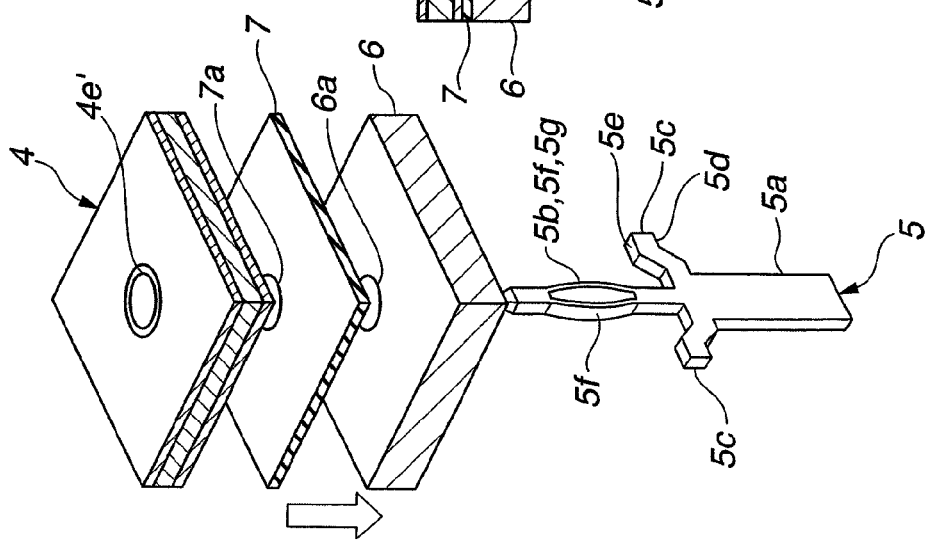

FIG.14A FIG.14B
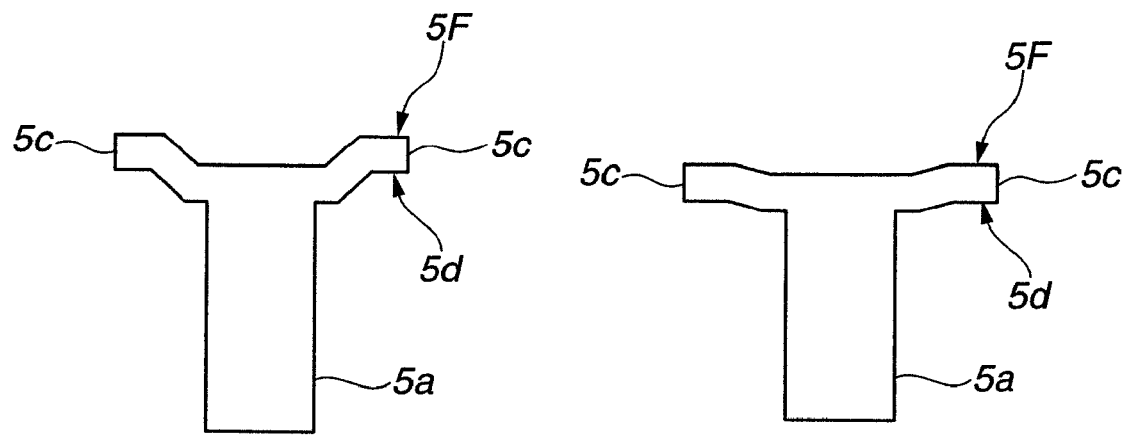
FIG.15
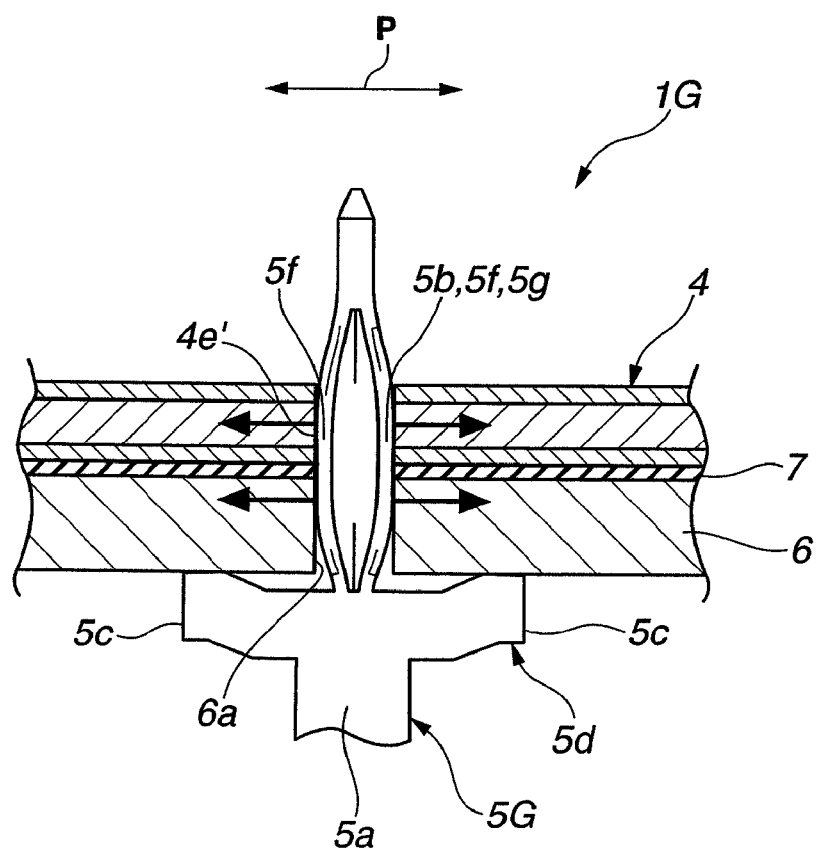

ELECTRONIC DEVICE INCLUDING CIRCUIT BOARD WITH RADIATING MEMBER, HYDRAULIC UNIT INCLUDING THE ELECTRONIC DEVICE, AND METHOD OF FIXING THE RADIATING MEMBER TO THE CIRCUIT BOARD

BACKGROUND OF THE INVENTION

The present invention relates to an electronic device including a circuit board with a radiating member, a hydraulic unit including the electronic device, and a method of fixing the radiating member to the circuit board.

Conventionally, there has been proposed an electronic device including a circuit board to which electronic parts are installed, and a radiating member that is fixed to the circuit board and radiates heat generated from the electronic parts.

Japanese Patent Application First Publication No. 11-17371 discloses an electronic device in which a radiating member is fixed to the circuit board by soldering.

SUMMARY OF THE INVENTION

However, in the electronic device of the above-described conventional art, the heat generated from the electronic parts is transmitted to the solder having a heat fusibility, thereby causing deterioration in strength of a mounting portion (i.e., a connecting portion) at which the radiating member is fixed to the circuit board through the solder. This results in poor reliability in fixing the radiating member to the circuit board.

It is an object of the present invention to improve the reliability in fitting a radiating member to a circuit board.

In one aspect of the present invention, there is provided an electronic device comprising:
  a circuit board onto which an electronic part is installed;
  a radiating member; and
  at least one fitting member that fixes the radiating member to the circuit board,
  wherein the fitting member is formed with a resilient portion that is configured to produce a resilient restoring force and holds the radiating member in a state fixed to the circuit board by the resilient restoring force.

In a further aspect of the present invention, there is provided a hydraulic unit comprising the electronic device according to claim 1, the hydraulic unit further comprising:
  a housing that is connected with brake pipes connected with a master cylinder and a wheel cylinder, respectively, and has a built-in construction including a pump so as to increase and decrease a wheel cylinder pressure; and
  a motor that is mounted to one end surface of the housing and drives the pump,
  wherein the electronic device is mounted to the other end surface of the housing and controls operation of the motor,
  wherein the radiating member of the electronic device is arranged near a line extending perpendicular to an axis that extends from a center of gravity of the hydraulic unit along a direction of gravity.

In a further aspect of the present invention, there is provided a hydraulic unit comprising the electronic device according to claim 1, the hydraulic unit further comprising:
  a housing that is connected with brake pipes connected with a master cylinder and a wheel cylinder, respectively, and has a built-in construction including a pump so as to increase and decrease a wheel cylinder pressure; and
  a motor that is mounted to one end surface of the housing and drives the pump; and
  support portions that are fixed to a vehicle body through a bracket,
  wherein the electronic device is mounted to the other end surface of the housing and controls operation of the motor,
  wherein the radiating member of the electronic device is arranged within a region defined by lines that extend through the support portions and substantially parallel to opposed side surfaces of the housing.

In a still further aspect of the present invention, there is provided a method of fixing a radiating member to a circuit board in an electronic device, the method comprising the steps of:
  overlapping the radiating member and the circuit board such that a through hole formed in the circuit board is communicated with a fitting hole formed in the radiating member; and
  press-fitting a press-fit terminal formed on a fitting member into the through hole through the fitting hole until a center of resilient deformation of the press-fit terminal and a center of the through hole in a thickness direction of the circuit board are substantially aligned with each other, such that a resilient portion formed on the fitting member urges the radiating member toward the circuit board so as to support the radiating member between the resilient portion and the circuit board.

Other objects and features of this invention will become understood from the following description with reference to the accompanying drawings.

BRIEF DESCRIPTION OF THE DRAWINGS

FIG. 6 is a perspective view of a radiating member and a vicinity thereof in the electronic device of the first embodiment of the present invention.

FIG. 7A to FIG. 7D are explanatory diagrams showing a process of fixing the radiating member to the circuit board by means of the fitting member in the first embodiment of the present invention.

FIG. 14A is a perspective view of a fitting member of an electronic device according to a fifth modification of the first embodiment of the present invention, and FIG. 14B is a view similar to FIG. 14A but shows a fitting member having a rigidity lower than that of the fitting member shown in FIG. 14A.

FIG. 15 is a vertical cross-section of an essential part of an electronic device according to a second embodiment of the present invention.

DETAILED DESCRIPTION OF THE INVENTION

[First Embodiment]

Referring to FIG. 1 to FIG. 9C, a first embodiment of the present invention is explained.

Figure 1:
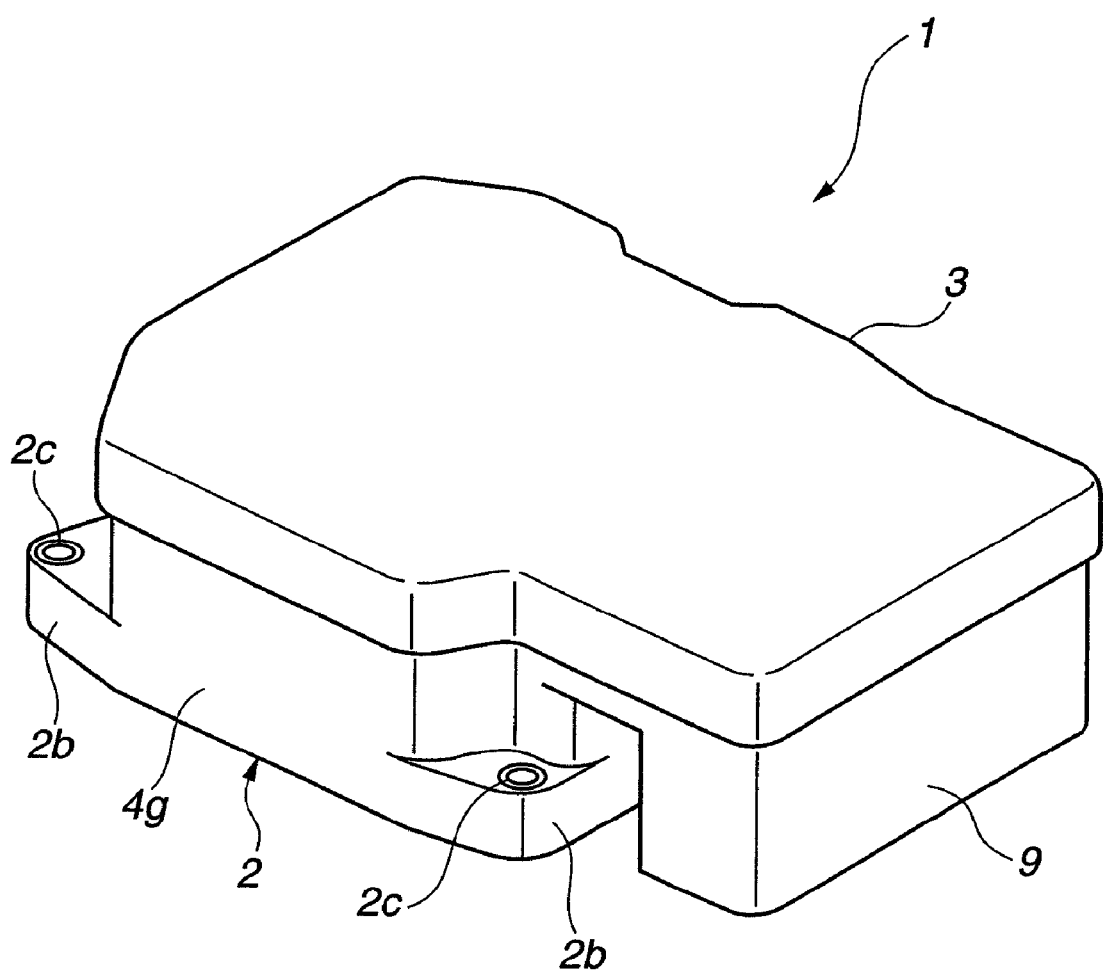
FIG. 1 is a perspective view of an electronic device according to a first embodiment of the present invention.
Figure 2:
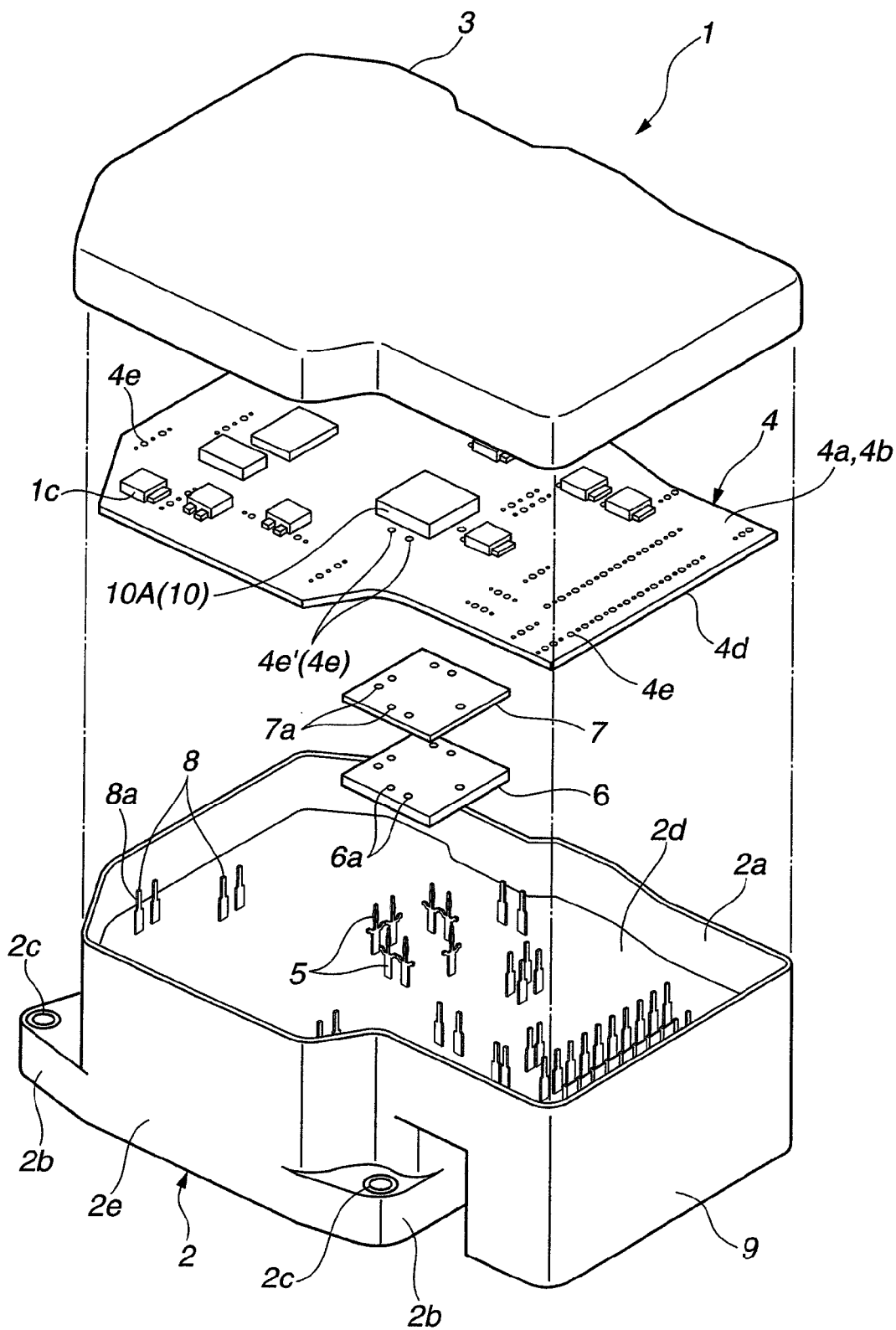
FIG. 2 is an exploded perspective view of the electronic device of the first embodiment of the present invention.

As shown in FIG. 1 and FIG. 2, electronic device 1 of the first embodiment includes generally rectangular base 2, generally rectangular cover 3 secured to base 2, circuit board 4 that is accommodated in an inside space between base 2 and cover 3, radiating plate 6 as a radiating member, and insulator 7 interposed between radiating plate 6 and circuit board 4. Radiating plate 6 is fixed to circuit board 4 by means of at least one fitting member 5. In this embodiment, a plurality of fitting members 5 are used.

As shown in FIG. 2, base 2 includes accommodating recess portion 2a that is formed on an upper portion of base 2 so as to be opposed to cover 3 and upwardly opened. Base 2 further includes two mounting brackets 2b that are formed on an outer periphery of lower portion 2e of base 2 and spaced from each other along the outer periphery of lower portion 2e. Each of two mounting brackets 2b has tapped hole 2c for a fixing bolt. Base 2 is secured to a vehicle body through the fixing bolt which is inserted into tapped hole 2c of mounting bracket 2b. Accommodating recess portion 2a has bottom surface 2d on which a plurality of terminal members 8 and fitting members 5 are provided in an upright state. Base 2 further includes connector 9 that has a plurality of terminal members 8. Connector 9 is connected to an external device through a harness.

As shown in FIG. 2, each of terminal members 8 has press-fit terminal 8a on a tip end portion thereof.

Cover 3 is made of a metal material, for instance, aluminum, iron, stainless steel. In this embodiment, cover 3 is formed by pressing a thin steel plate. Cover 3 extends over accommodating recess portion 2a of base 2 so as to cover accommodating recess portion 2a. Cover 3 includes an outer circumferential side wall that is fitted onto an outer circumferential upright wall of base 2 which defines accommodating recess portion 2a. Cover 3 is attached to base 2 by fitting the outer circumferential side wall to the outer circumferential upright wall of base 2.

Figure 3:
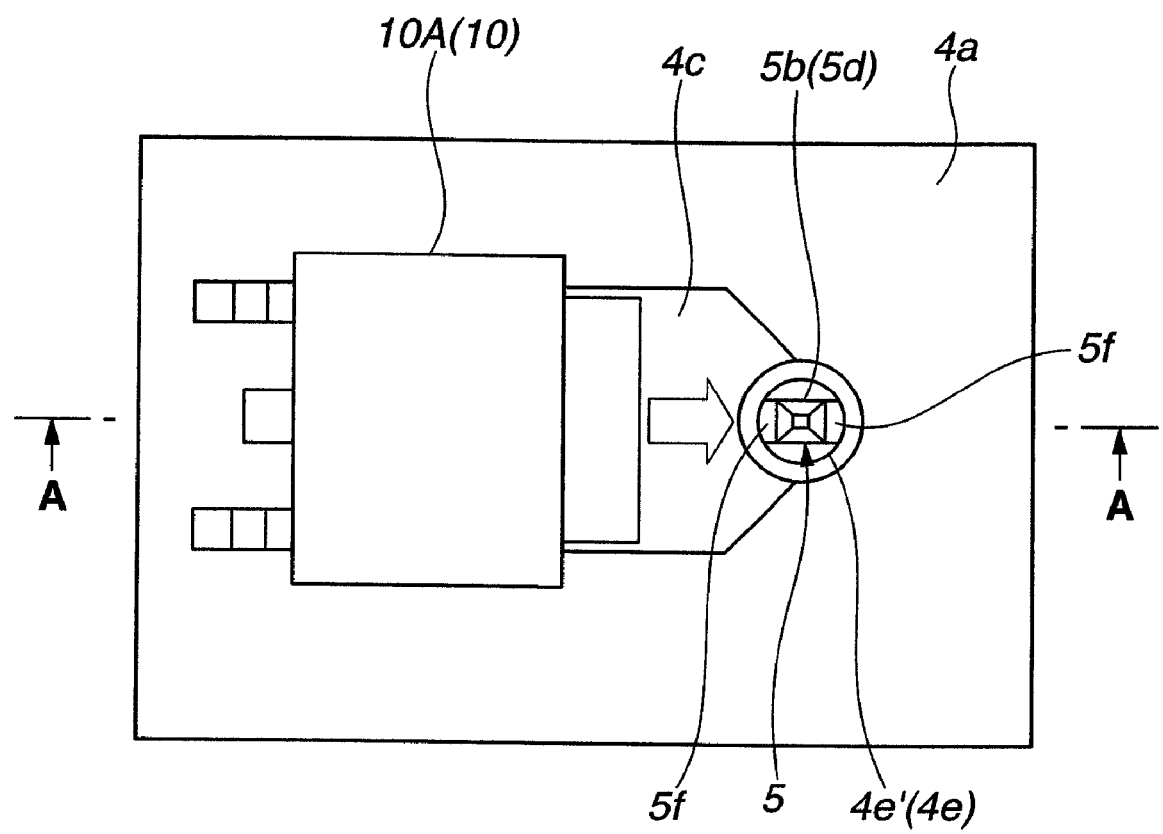
FIG. 3 is a plan view of electronic parts installed to a circuit board, and a vicinity of the electronic parts in the electronic device of the first embodiment of the present invention.
Figure 4:
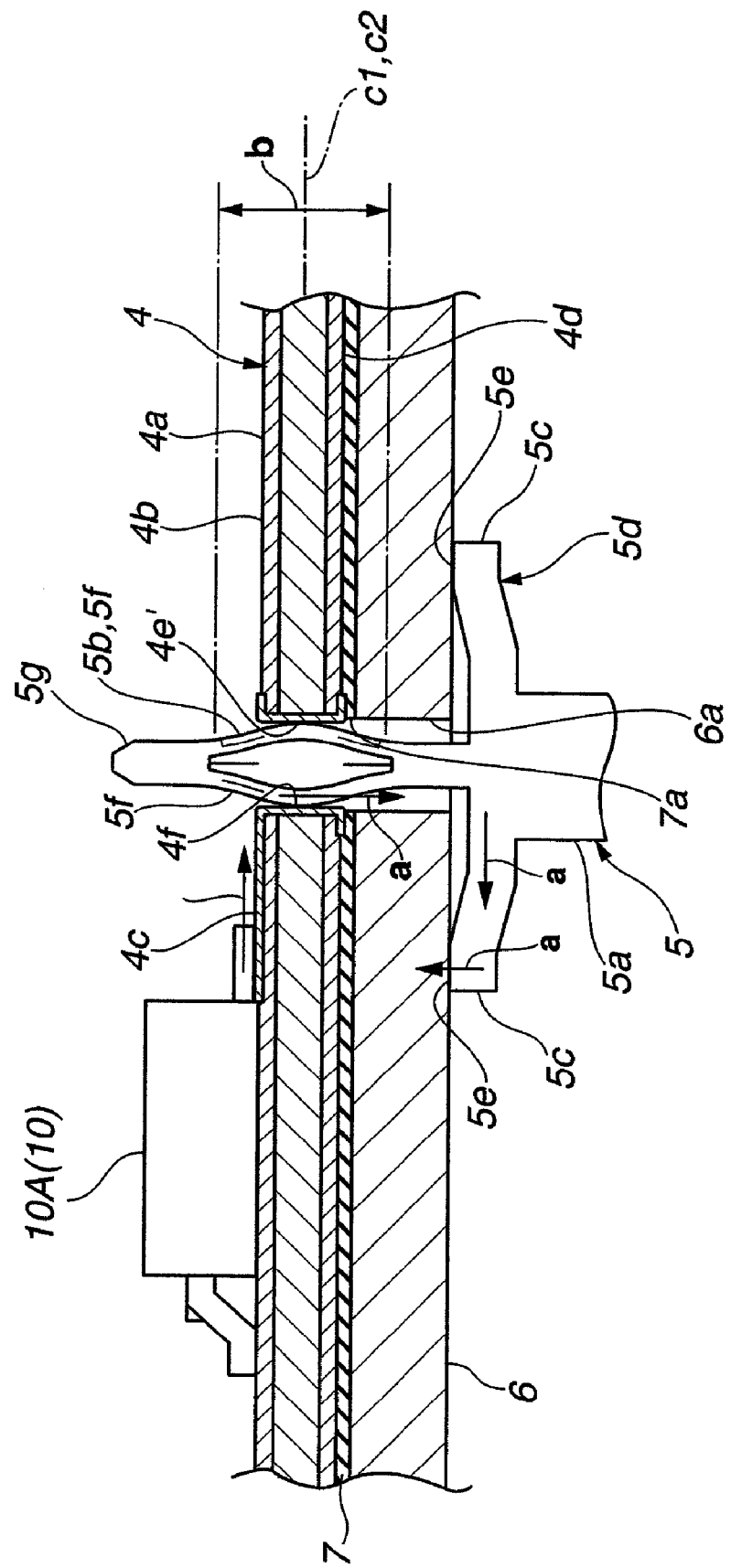
FIG. 4 is a cross-section taken along line A-A shown in FIG. 3.

As shown in FIG. 2 and FIG. 4, circuit board 4 includes generally rectangular and planar board 4a that has a multi-layer structure, for instance, a three-layered structure. Circuit board 4 is made of an insulating synthetic resin material. Circuit board 4 (i.e., board 4a) has one side surface 4b and opposite side surface 4d which are opposed to each other in a thickness direction of circuit board 4. A plurality of electronic parts 10 as shown in FIG. 2 and FIG. 3, such as a semiconductor IC, a capacitor, a coil and a transistor, are installed on one side surface 4b of circuit board 4. Electronic parts 10 are connected with each other through printed wiring 4c (i.e., an electric wiring) partly shown in FIG. 3. Radiating plate 6 is fixed to opposite side surface 4d of circuit board 4 via insulator 7. Radiating plate 6 is positioned so as to overlap with electronic part 10A that generates a relatively large amount of heat among electronic parts 10.

Circuit board 4 is formed with a plurality of through holes 4e, 4e' that penetrate circuit board 4 in a direction of a thickness of circuit board 4. As shown in FIG. 4, conductive plate 4f is disposed inside each of through holes 4e, 4e' so as to cover a circumferential surface that defines through hole 4e, 4e'. Conductive plate 4f is integrally connected to printed wiring 4c. Terminal members 8 and fitting members 5 are inserted into, i.e., press-fit into through holes 4e, 4e', respectively, so that circuit board 4 is fixed to base 2 by terminal members 8 and fitting members 5. Through holes 4e' into which fitting members 5 are inserted serve as first fitting holes. Through holes 4e' are formed around electronic part 10A in proximity of electronic part 10A.

As shown in FIG. 2, FIG. 4 and FIG. 6, radiating plate 6 is formed into a generally rectangular flat plate-shape and has a heat transfer property. Radiating plate 6 is formed with a plurality of through holes 6a which are positioned in alignment with through holes 4e'. Through holes 6a serving as second fitting holes are communicated with through holes 4e' as the first fitting holes.

Insulator 7 is made of an insulating material and formed into a generally rectangular flat plate-shape. Insulator 7 is formed with a plurality of through holes 7a which are positioned in alignment with through holes 4e' and through holes 6a. Through holes 7a serving as third fitting holes are communicated with through holes 4e' as the first fitting holes and through holes 6a as the second fitting holes.

Figure 5:
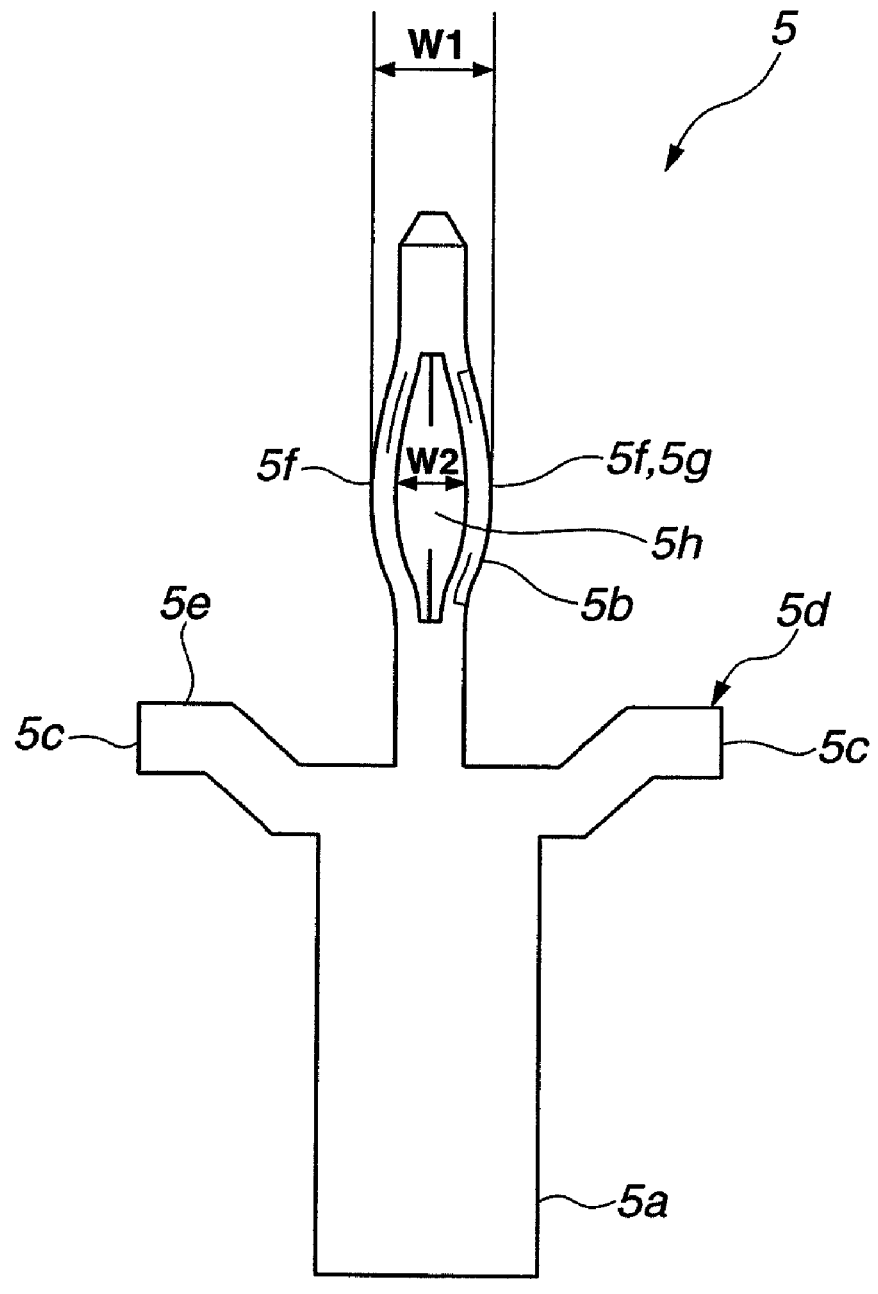
FIG. 5 is a side view of a fitting member of the electronic device of the first embodiment of the present invention.

As shown in FIG. 5, each of fitting members 5 includes resilient portion 5d that produces a resilient restoring force and holds radiating plate 6 in a state fixed to circuit board 4 by the resilient restoring force. Specifically, fitting member 5 includes body portion 5a, press-fit terminal 5g that extends from a tip end of body portion 5a and serves as an insertion portion, and at least one press portion 5c that is formed to extend from an outer periphery of a tip end portion of body portion 5a. Press-fit terminal 5g is formed with press-fit portion 5b that cooperates with press portion 5c to constitute resilient portion 5d.

Press-fit terminal 5g is a terminal with press-fit portion 5b. Fitting member 5 is formed by stamping a thin metal plate, for instance, by a press. Specifically, press-fit portion 5b includes a pair of plate spring portions 5f that are opposed to each other. Plate spring portions 5f define an opening having width W2 therebetween. Press-fit terminal 5g (i.e., plate spring portions 5f) is formed by driving a jig that has diameter w2 into terminal neck portion 5h. Press-fit portion 5b in a non-fixed state has width w1 that is larger than a diameter of each of through holes 4e'. As shown in FIG. 4, press-fit terminal 5g is inserted into through hole 4e' (the first fitting hole) via through hole 6a (the second fitting hole) and through hole 7a (the third fitting hole) so that press-fit portion 5b is press-fit into through hole 4e' to thereby produce the resilient restoring force. When press-fit terminal 5g is inserted into through hole 4e', press-fit portion 5b is pressed against and contacted with conductive plate 4f that covers the circumferential surface of through hole 4e', and thereby press-fit portion 5b allows electric connection between fitting member 5 and conductive plate 4f inside through hole 4e'. Further, radiating plate 6 is held in the state fixed to circuit board 4 by the resilient restoring force of press-fit portion 5b which is produced when press-fit portion 5b is press-fit into through hole 4e'.

Press portion 5c serving as resilient portion 5d is configured to produce a resilient restoring force, and presses radiating plate 6 toward circuit board 4 and supports radiating plate 6 between circuit board 4 and press portion 5c by the resilient restoring force. Specifically, press portion 5c acts on radiating plate 6 so as to bias a substantial center of gravity of radiating plate 6 toward circuit board 4. Press portion 5c extends from body portion 5a in a direction crossing the insertion direction of press-fit portion 5b in which press-fit portion 5b is inserted into through hole 4e'. Press portion 5c is formed into an arm-shape. More specifically, a plurality of press portions 5c, in this embodiment, two press portions 5c are formed so as to extend from body portion 5a in different directions that are opposite to each other and in the insertion direction of press-fit portion 5b into through hole 4e'. Preferably, press portions 5c are formed so as to extend along a direction of an outer surface of radiating plate 6. In addition, preferably, press portions 5c are formed so as to extend parallel to width direction B of press-fit portion 5b as shown in FIG. 5.

Each of press portions 5c has substantially flat contact surface 5e. When press-fit terminal 5g is inserted into through hole 4e', contact surface 5e is brought into contact with the outer surface of radiating plate 6 and press portions 5c are resiliently deformed to press radiating plate 6 toward circuit board 4. Owing to the resilient deformation of press portions 5c, radiating plate 6 is held in the state fixed to circuit board 4 by the resilient restoring force of press portions 5c which is produced when press-fit terminal 5g is press-fit into through hole 4e'. That is, in this embodiment, radiating plate 6 is held in the state fixed to circuit board 4 by both the resilient restoring force of press portions 5c and the resilient restoring force of press-fit portion 5b.

Figure 8B:
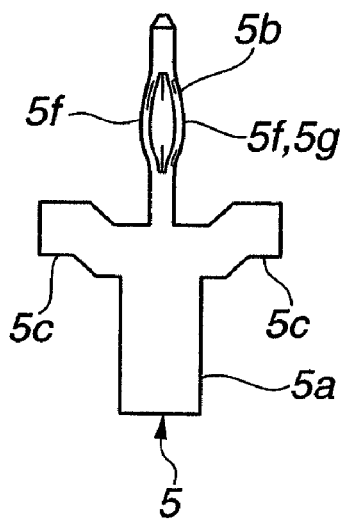
FIG. 8A to FIG. 8C are explanatory diagrams showing a rigidity of the fitting member in the first embodiment of the present invention.
Figure 8A:
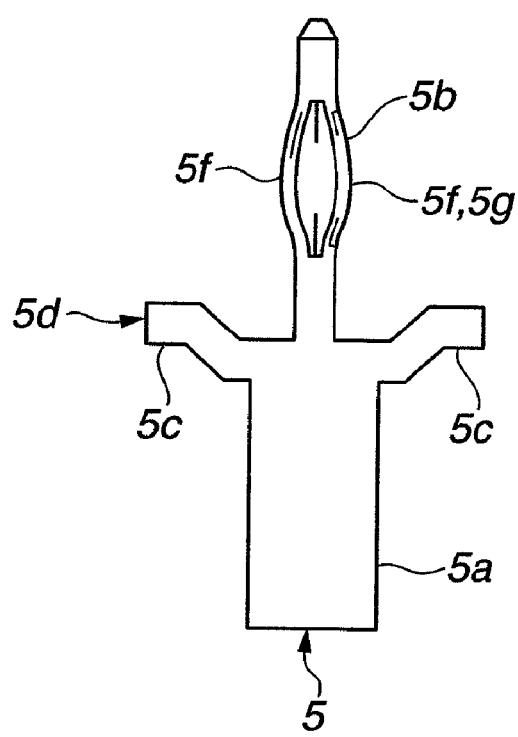
Figure 8C:
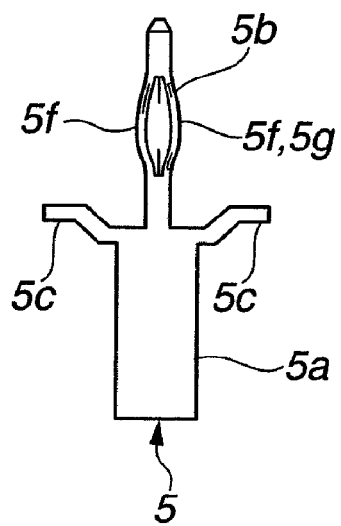
Figure 9A:
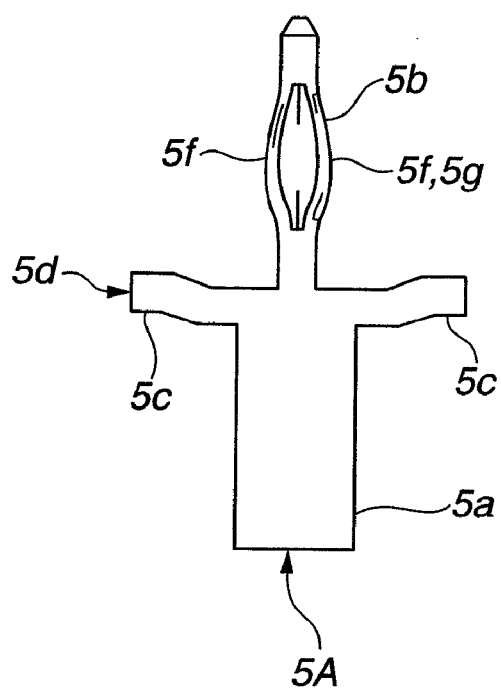
FIG. 9A to FIG. 9C are explanatory diagrams showing a rigidity of the fitting member in the first embodiment of the present invention.
Figure 9B:
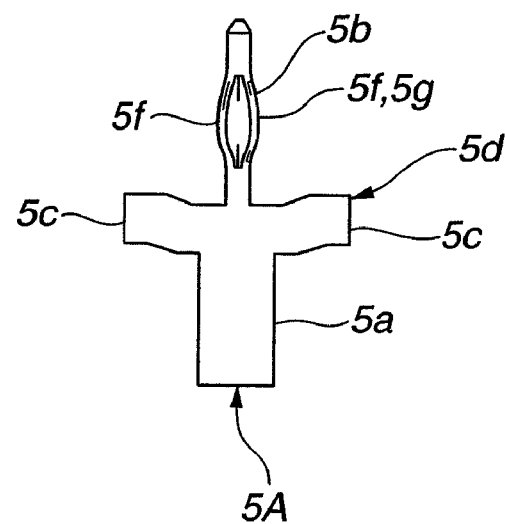
Figure 9C:
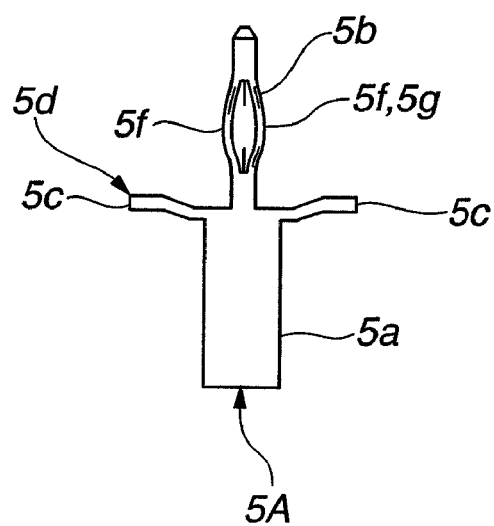

The rigidity of press portions 5c of fitting member 5 is now explained. The rigidity of press portions 5c can be adjusted by varying a degree of bending of press portions 5c with respect to the insertion direction of press-fit portion 5b into through hole 4e'. FIGS. 8A-8C show fitting members 5 with press portions 5c that have a relatively large degree of bending, respectively. FIGS. 9A-9C show fitting members 5A with press portions 5c that have a relatively small degree of bending, respectively. Further, the rigidity of press portions 5c of fitting members 5, 5A can be adjusted by varying a thickness of press portions 5c. That is, the rigidity of press portions 5c shown in FIG. 8B and FIG. 9B becomes larger than the rigidity of press portions 5c shown in FIG. 8A and FIG. 9A by increasing the thickness of press portions 5c shown in FIG. 8B and FIG. 9B as compared to the thickness of press portions 5c shown in FIG. 8A and FIG. 9A. The rigidity of press portions 5c shown in FIG. 8C and FIG. 9C becomes smaller than the rigidity of press portions 5c shown in FIG. 8A and FIG. 9A by reducing the thickness of press portions 5c shown in FIG. FIG. 8C and FIG. 9C as compared to the thickness of press portions 5c shown in FIG. 8A and FIG. 9A.

Through holes 4e' of circuit board 4 are arranged so as to allow electrical conduction between electronic part 10A and press-fit portions 5b inserted into through holes 4e' and heat transfer between electronic part 10A and radiating plate 6 through press-fit portions 5b.

A method of fixing radiating plate 6 to circuit board 4 is explained by referring to FIGS. 7A-7D. Radiating plate 6 and circuit board 4 are overlapped via insulator 7 therebetween such that through holes 4e' of circuit board 4 are aligned with and communicated with through holes 6a of radiating plate 6 and through holes 7a of insulator 7 as shown in FIG. 7A. Next, as shown in FIG. 7B, press-fit terminals 5g of fitting members 5 are inserted from through holes 6a and press-fit into through holes 4e' until center c1 of resilient deformation of press-fit terminals 5g and center c2 of through holes 4e' in thickness direction b of circuit board 4 are substantially aligned with each other as shown in FIG. 4. In this state, press portions 5c (i.e., resilient portion 5d) of fitting members 5 urge radiating plate 6 toward circuit board 4 so as to support radiating plate 6 between press portions 5c and circuit board 4. At this time, press-fit portions 5b (i.e., resilient portion 5d) of press-fit terminals 5g are kept in the state press-fitted to through holes 4e' and thereby press and support radiating plate 6. Thus, as shown in FIG. 7C and FIG. 7D, radiating plate 6 is fixed to circuit board 4 and held in the state fixed to circuit board 4 by press-fit portions 5b and press portions 5c.

In thus-constructed electronic device 1, as shown in FIG. 4, the heat generated in electronic part 10A is transferred to radiating plate 6 through printed wiring 4c, through holes 4e' of circuit board 4, press-fit terminals 5g and press portions 5c of fitting members 5 and then is released from radiating plate 6. Also, the heat generated in electronic part 10A is transferred to radiating plate 6 through circuit board 4 and insulator 7 and released from radiating plate 6.

Functions and effects of electronic device 1 of this embodiment are now explained along with structural features of electronic device 1.

In this embodiment, electronic device 1 includes circuit board 4 onto which electronic parts 10 (10A) is installed, radiating plate 6, and fitting members 5 that are configured to fix radiating plate 6 to circuit board 4. Each of fitting member 5 includes resilient portion 5d that is configured to produce a resilient restoring force and holds radiating plate 6 in a state fixed to circuit board 4 by the resilient restoring force. With this construction, radiating plate 6 can be prevented from suffering from influence due to the heat released from radiating plate 6, so that reliability of fixing radiating plate 6 to circuit board 4 can be increased.

Further, in this embodiment, resilient portion 5d produces a resilient restoring force and presses radiating plate 6 toward circuit board 4 by the resilient restoring force. Resilient portion 5d includes press portions 5c that cooperate with circuit board 4 to support radiating plate 6 therebetween. With this construction, radiating plate 6 can be rigidly fixed to circuit board 4.

Further, in this embodiment, press portions 5c act on radiating plate 6 so as to bias the substantial center of gravity of radiating plate 6 toward circuit board 4. Owing to the biasing by press portions 5c, radiating plate 6 can be rigidly fixed to circuit board 4.

Further, in this embodiment, circuit board 4 is formed with through holes 4e' as the first fitting holes, and radiating plate 6 is formed with through holes 6a as the second fitting holes which are communicated with through holes 4e'. Fitting member 5 includes body portion 5a and press-fit terminal 5g that is continuously connected with body portion 5a and inserted into through holes 4e' and through holes 6a. With this construction, it is possible to perform relative positioning of fitting members 5, circuit board 4 and radiating plate 6.

Further, in this embodiment, when press-fit terminal 5g is inserted into through hole 4e', press portions 5c is brought into contact with radiating plate 6 and resiliently deformed to press radiating plate 6 toward circuit board 4. Accordingly, in the process of assembling electronic device 1, radiating plate 6 is urged toward circuit board 4 by press portions 5c. The assembling work, therefore, can be facilitated.

Further, in this embodiment, the first fitting holes are constituted by through holes 4e' originally formed on circuit board 4, and therefore, it is not necessary to additionally form separate fitting holes only for the purpose of inserting fitting members 5. This serves for suppressing a complicated structure of circuit board 4.

Further, in this embodiment, press-fit terminal 5g serves as the terminal and the insertion portion. Press-fit terminal 5g is press-fit into through hole 4e' to thereby produce the resilient restoring force, and constitutes a part of resilient portion 5d of fitting member 5. By using the resilient restoring force of press-fit terminal 5g, radiating plate 6 can be fixed to circuit board 4.

Further, in this embodiment, through holes 4e' are arranged so as to allow electrical conduction between electronic part 10A and press-fit terminals 5g (i.e., press-fit portions 5b) inserted into through holes 4e' and heat transfer between electronic part 10A and radiating plate 6 through press-fit terminals 5g. With this arrangement, the heat generated in electronic part 10A can be transferred to radiating plate 6 through press-fit terminals 5g within through holes 4e'. This serves for efficiently radiating the heat from radiating plate 6.

Further, in this embodiment, through holes 4e' are arranged in the vicinity of electronic part 10A. Therefore, the heat transfer between electronic part 10A and radiating plate 6 through press-fit terminals 5g within through holes 4e' and the heat radiation from radiating plate 6 can be further efficiently performed.

Further, in this embodiment, resilient portion 5d includes press-fit portion 5b that is formed in press-fit terminal 5g (as the insertion portion) and is inserted into through hole 4e' to thereby produce the resilient restoring force. With the construction of resilient portion 5d, radiating plate 6 can be more rigidly fixed to circuit board 4 by the resilient restoring force of press-fit portion 5b.

Figure 10:
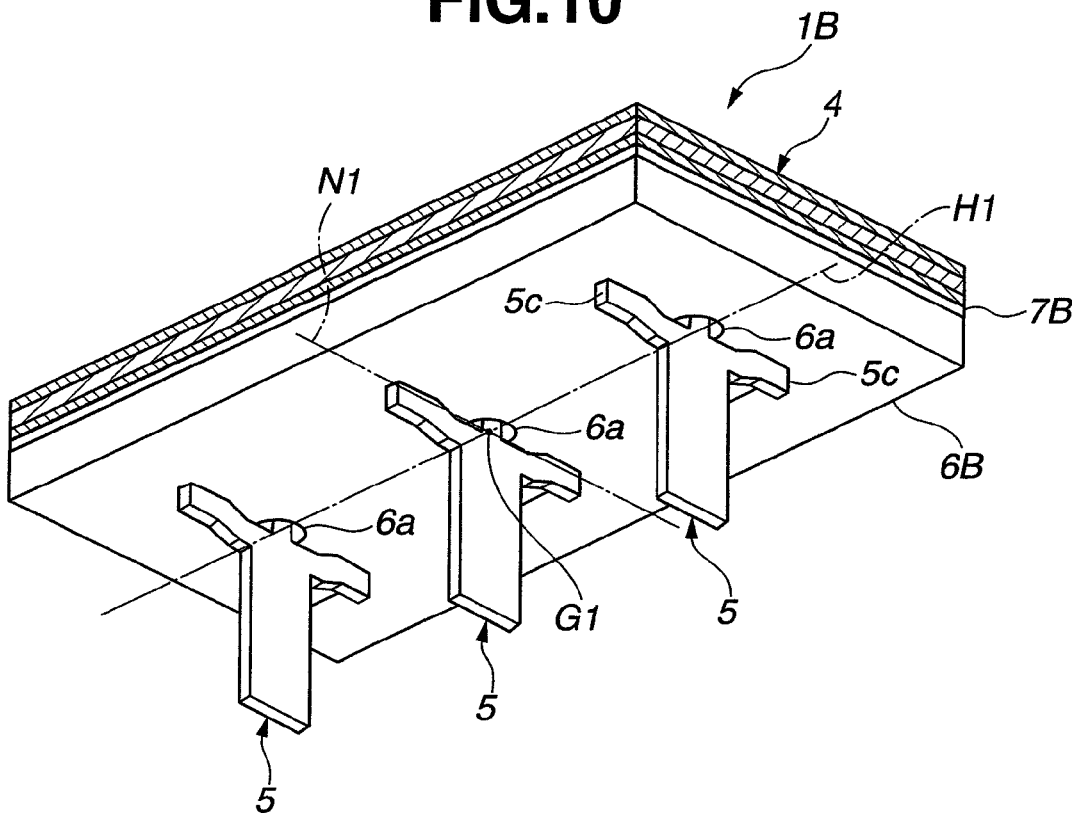
FIG. 10 is a perspective view of an essential part of an electronic device according to a first modification of the first embodiment of the present invention.
Figure 11:
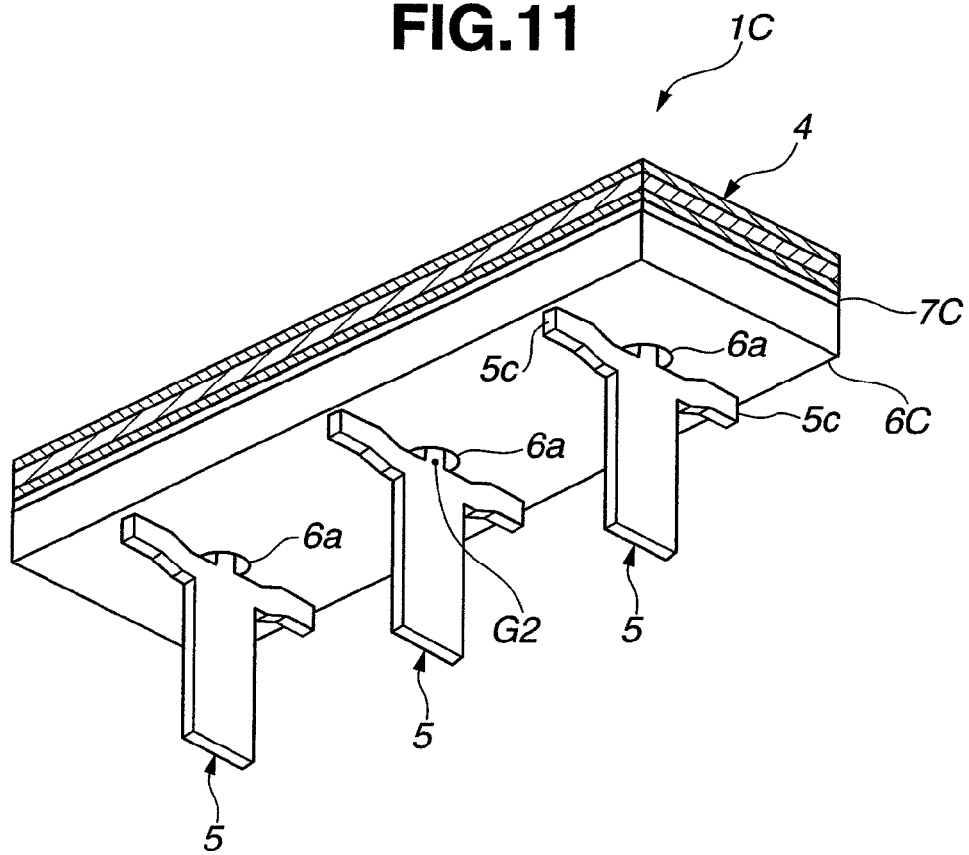
FIG. 11 is a perspective view of an essential part of an electronic device according to a second modification of the first embodiment of the present invention.
Figure 12:
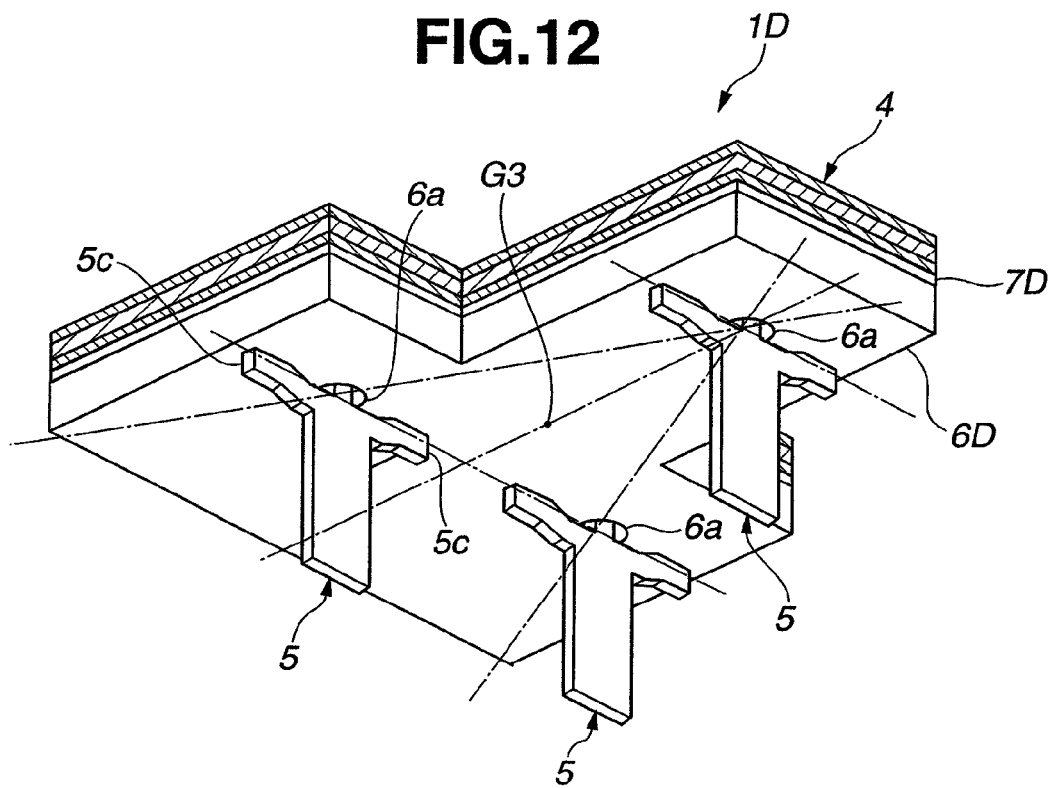
FIG. 12 is a perspective view of an essential part of an electronic device according to a third modification of the first embodiment of the present invention.
Figure 13:
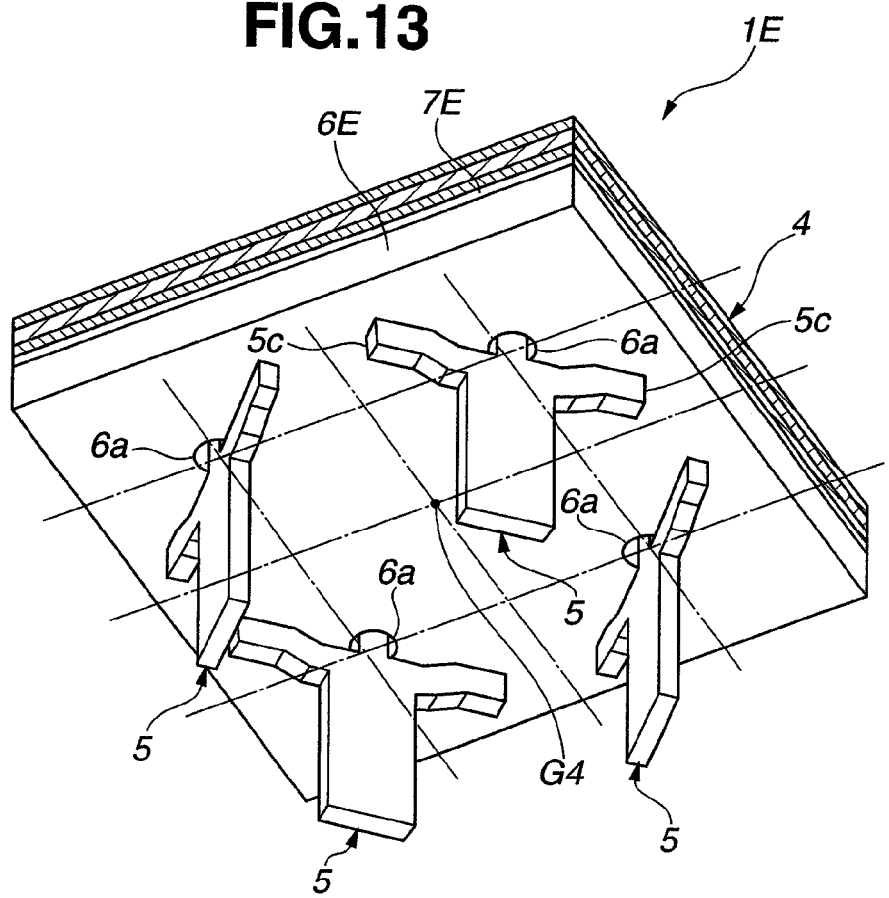
FIG. 13 is a perspective view of an essential part of an electronic device according to a fourth modification of the first embodiment of the present invention.

Furthermore, the first embodiment can be modified such that radiating plate 6 has various shapes in accordance with the installation position and the amount of heat generation from electronic part 10A. Modifications of the first embodiment are explained hereinafter. FIG. 10 is a perspective view showing an essential part of an electronic device of a first modification of the first embodiment. FIG. 11 is a perspective view showing an essential part of an electronic device of a second modification of the first embodiment. FIG. 12 a perspective view showing an essential part of an electronic device of a third modification of the first embodiment. FIG. 13 a perspective view showing an essential part of an electronic device of a fourth modification of the first embodiment.

As shown in FIG. 10, radiating plate 6B of electronic device 1B of the first modification is formed into a rectangular parallelepiped shape. Radiating plate 6B has longitudinal axis H1 and lateral axis N1 which extend in a same plane and intersect at center G1 of gravity of radiating plate 6B. Radiating plate 6B is fixed to circuit board 4 via insulator 7B by three fitting members 5 which are arranged in a row at equivalent intervals in a direction of longitudinal axis H1. Radiating plate 6B has a lateral width in a direction of lateral axis N1 which is larger than the width of each of fitting members 5 to a certain extent. One of three fitting members 5 is placed at center G1 of gravity of radiating plate 6B. The remaining two fitting members 5 are placed apart from the one fitting member 5 at a same distance therefrom along longitudinal axis H1, respectively with this arrangement, radiating plate 6B can be stably fixed to circuit board 4, thereby serving for providing an advantageous construction of electronic device 1B which is resistant to vibration of the vehicle body.

As shown in FIG. 11, radiating plate 6C of electronic device 1C of the second modification is formed into a rectangular parallelepiped shape and fixed to circuit board 4 via insulator 7C by three fitting members 5 which are arranged in a row at equivalent intervals similar to the first modification. One of the three fitting members 5 is positioned at center G2 of gravity of radiating plate 6C. Radiating plate 6C differs from radiating plate 6B of the first modification in that the lateral width of radiating plate 6C is substantially the same as the width of each of fitting members 5. Radiating plate 6C of the second modification can be stably held in the state fixed to circuit board 4.

As shown in FIG. 12, radiating plate 6D of electronic device 1D of the third modification is formed into a generally T-shape in plan view. Radiating plate 6D is fixed to circuit board 4 via insulator 7D by three fitting members 5 respectively arranged at three vertexes of an imaginary triangle that is formed in the generally T-shaped radiating plate 6D as shown in FIG. 12. A center of gravity of radiating plate 6D is indicated at G3.

As shown in FIG. 13, radiating plate 6E of electronic device 1E of the fourth modification is formed into a generally rectangular shape in plan view. Radiating plate 6E is fixed to circuit board 4 via insulator 7E by four fitting members 5 which are arranged in positions opposed to four corners of the generally rectangular radiating plate 6E, respectively. A center of gravity of radiating plate 6E is indicated at G4.

In the third modification shown in FIG. 12 and the fourth modification shown in FIG. 13, fitting members 5 are arranged so as to enclose or surround center G3 of gravity of radiating plate 6D and center G4 of gravity of radiating plate 6E, respectively. With this arrangement, electronic devices 1D and 1E have an advantageous construction resistant to vibration of the vehicle body similar to the first modification.

The first embodiment can be further modified such that fitting member 5 has a configuration different from that of the first embodiment. FIG. 14A and FIG. 14B show a fifth modification of the first embodiment in which fitting member 5F is constituted of body portion 5a and press portions 5c only. Fitting member 5F shown in FIG. 14A is configured to have a rigidity larger than a rigidity of fitting member 5F shown in FIG. 14B.

[Second Embodiment]

Referring to FIG. 15, there is shown a second embodiment of the present invention which differs from the first embodiment in construction of the fitting member. FIG. 15 is a vertical cross-section of a part of an electronic device of the second embodiment. It should be noted that conductive plate 4f is not shown in FIG. 15 for the sake of simple illustration but conductive plate 4f is disposed inside through hole 4e' similar to the first embodiment. Like reference numerals denote like parts, and therefore, detailed explanations therefor are omitted.

As shown in FIG. 15, fitting member 5G of electronic device 1G of the second embodiment includes press-fit portion 5b that is configured to be press-fit into both through hole 4e' (i.e., the first fitting hole) of circuit board 4 and through hole 6a (i.e., the second fitting hole) of radiating member 6. Other parts are the same as those of the first embodiment.

In the second embodiment, since press-fit portion 5b of fitting member 5G is configured to be press-fit into both through hole 4e' of circuit board 4 and through hole 6a of radiating member 6, radiating plate 6 can be surely supported together with circuit board 4 by press-fit portion 5b when press-fit portion 5b is press-fit into through hole 4e' and through hole 6a. Therefore, radiating member 6 can be more stiffly fixed to circuit board 4. Specifically, radiating member 6 having a relatively heavy weight is supported by plate spring portions 5f of press-fit portion 5b in direction P of vibration of the vehicle body, so that the vibration of the vehicle body can be effectively absorbed.

[Third Embodiment]

Figure 16:
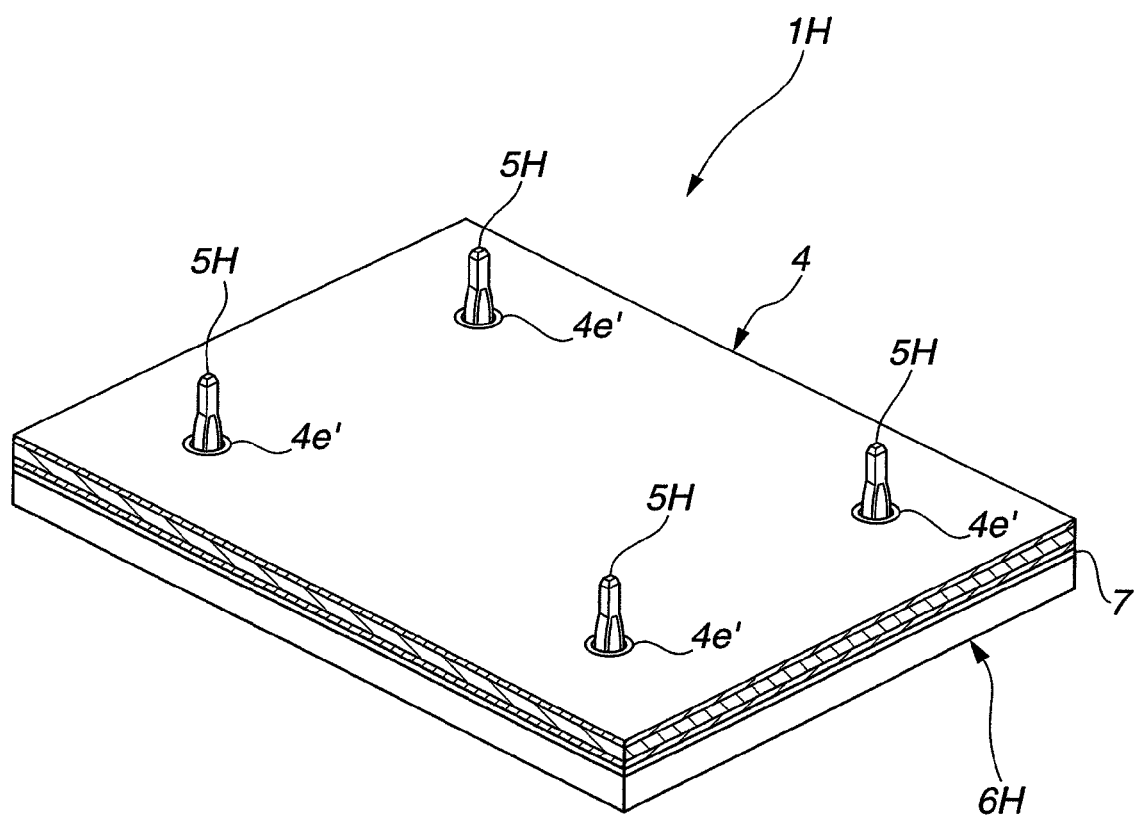
FIG. 16 is a perspective view of an essential part of an electronic device according to a third embodiment of the present invention.
Figure 17:
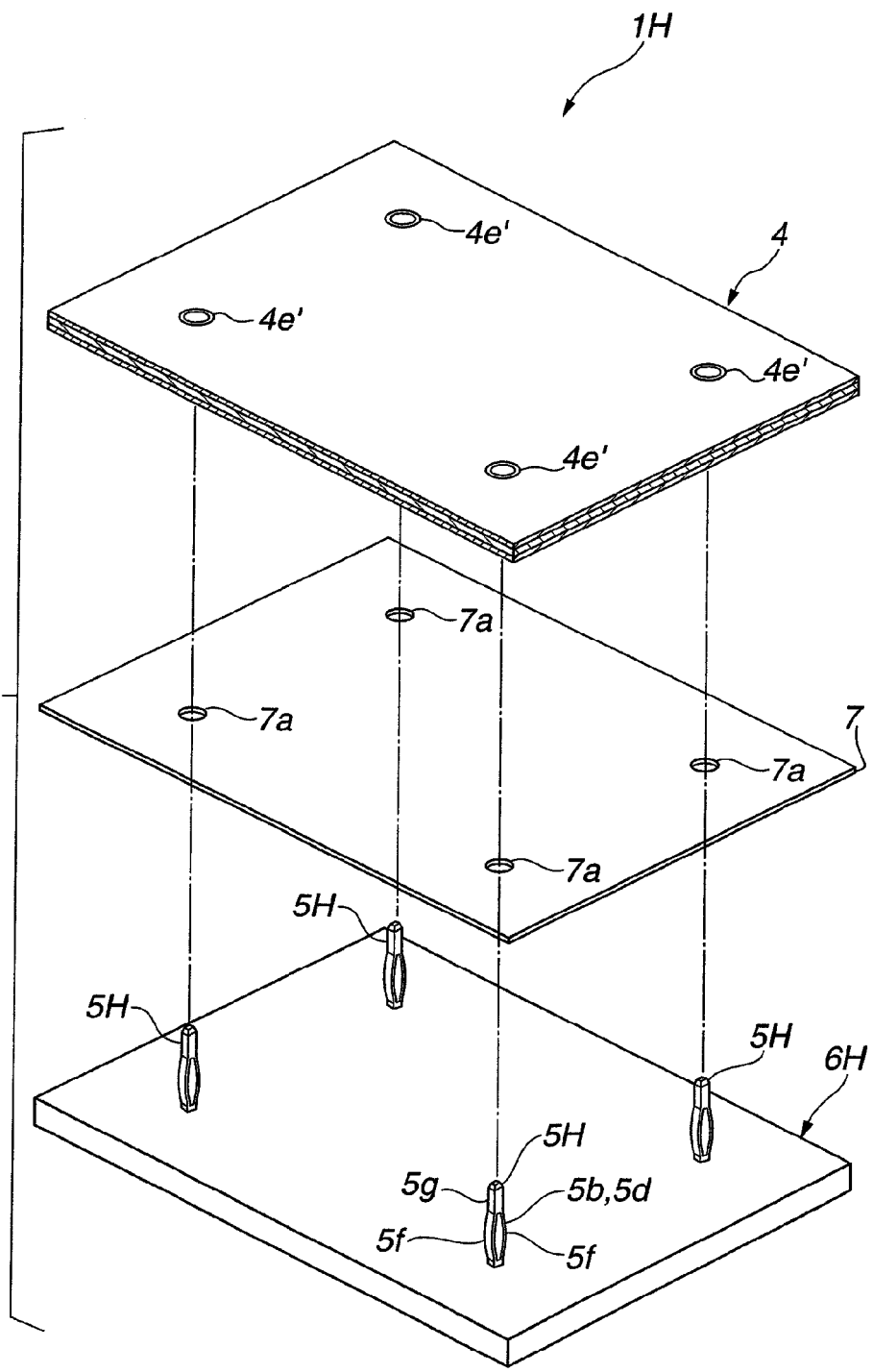
FIG. 17 is an exploded perspective view of the essential part of the electronic device according to the third embodiment of the present invention.

Referring to FIG. 16 and FIG. 17, there is shown a third embodiment of the present invention which differs from the first embodiment in construction of the fitting members. FIG. 16 is a perspective view of an essential part of an electronic device of the third embodiment. FIG. 17 is an exploded perspective view of an essential part of an electronic device of the third embodiment. Like reference numerals denote like parts, and therefore, detailed explanations therefor are omitted.

As seen from FIG. 16 and FIG. 17, fitting members 5H of electronic device 1H are integrally formed with radiating plate 6H.

Each of fitting members 5H is constituted of press-fit terminal 5g and provided with no press portions 5c shown in the first embodiment. Fitting member 5H is inserted into through hole 7a (i.e., the third fitting hole) of insulator 7 and through hole 4e' (i.e., the first fitting hole) of circuit board 4, so that press-fit terminal 5g is press-fit into through hole 4e'. Fitting member 5H is integrally formed with radiating plate 6H, for instance, by press working.

In the third embodiment, since fitting members 5H are integrally formed with radiating plate 6H, radiating plate 6H can be fixed to circuit board 4 without using base 2.

Fitting members 5H can be formed separately from radiating plate 6H by press working. In this case, fitting members 5H can be integrally connected to radiating plate 6H by press-fitting fitting members 5H into radiating plate 6H.

[Fourth Embodiment]

Figure 18:
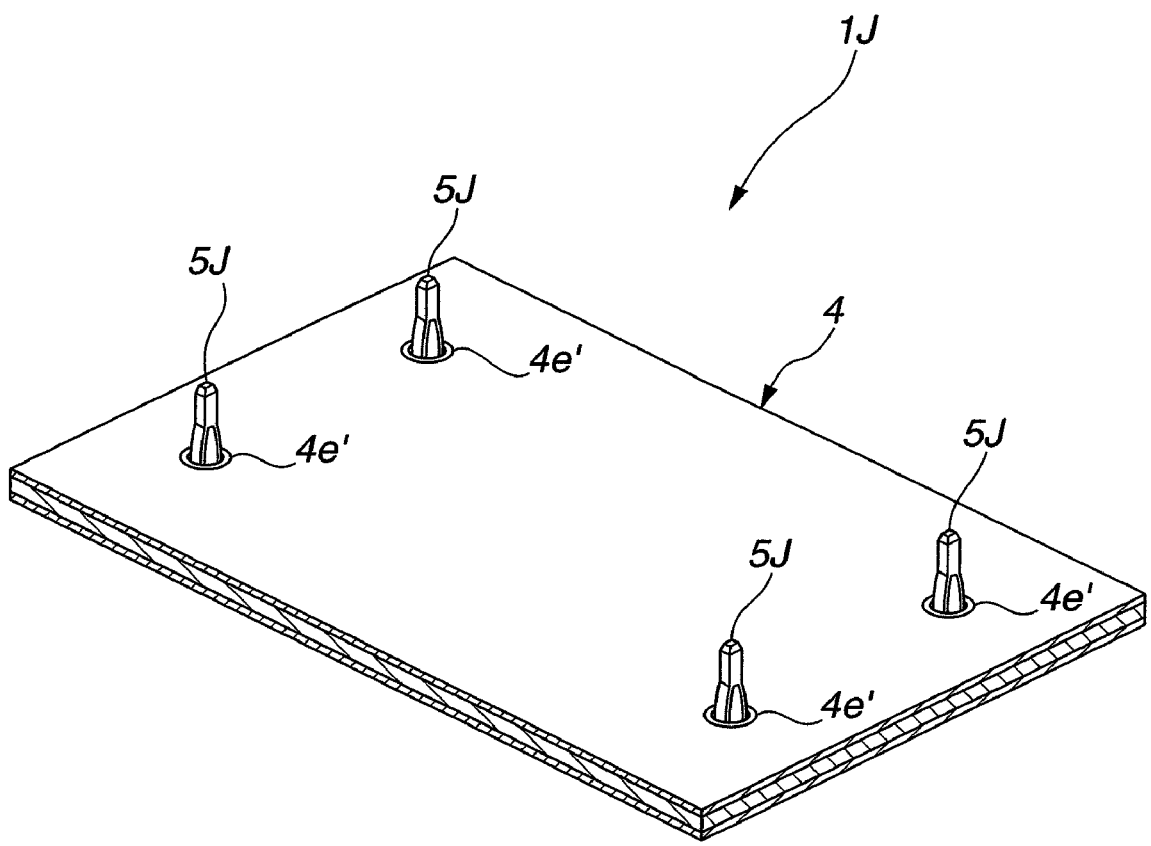
FIG. 18 is a perspective view of an essential part of an electronic device according to a fourth embodiment of the present invention.
Figure 19:
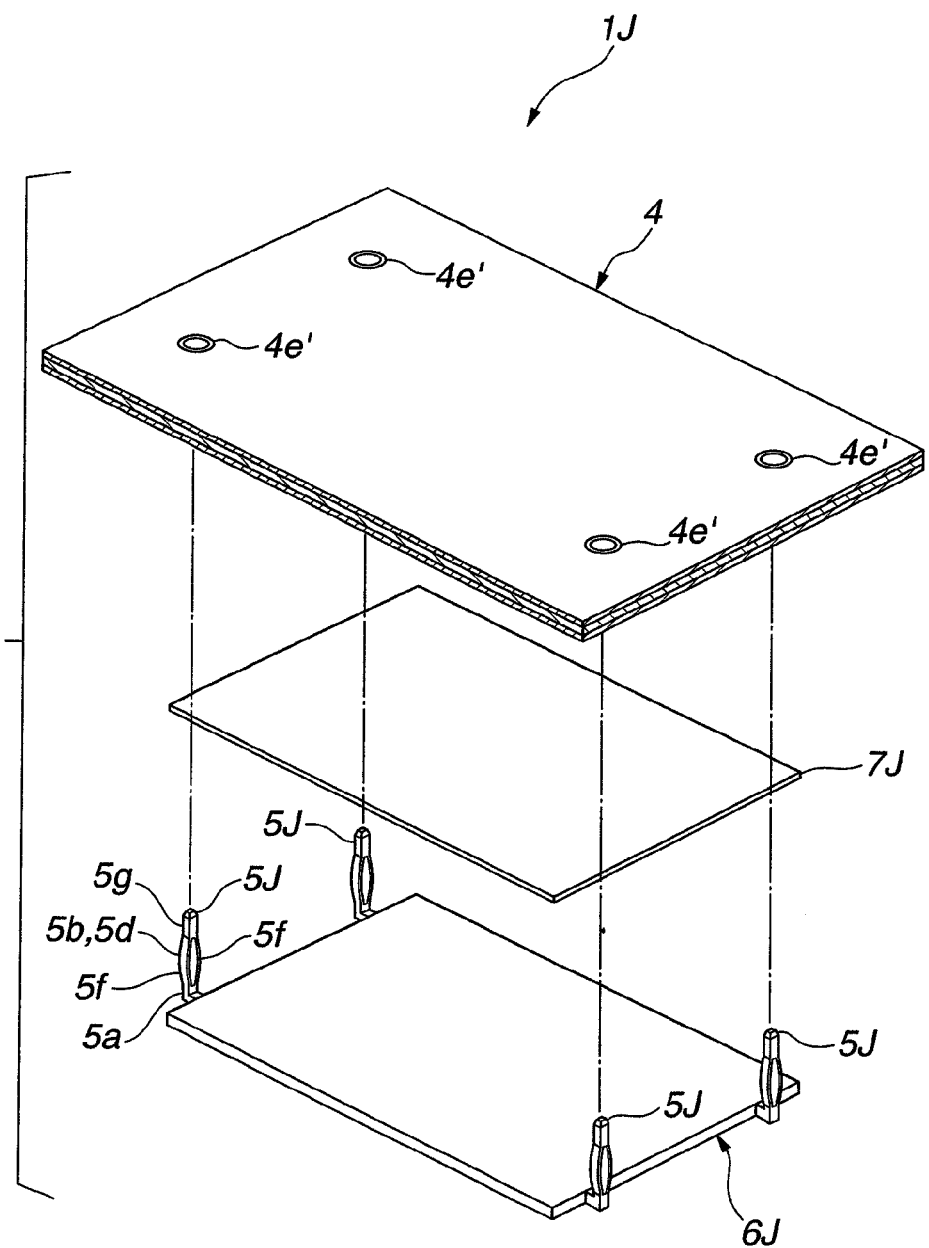
FIG. 19 is an exploded perspective view of the essential part of the electronic device according to the fourth embodiment of the present invention.

Referring to FIG. 18 and FIG. 19, there is shown a fourth embodiment of the present invention which differs from the first embodiment in construction of the fitting members. FIG. 18 is a perspective view of an essential part of an electronic device of the fourth embodiment. FIG. 19 is an exploded perspective view of an essential part of an electronic device of the fourth embodiment. Like reference numerals denote like parts, and therefore, detailed explanations therefor are omitted.

As seen from FIG. 18 and FIG. 19, fitting members 5J of electronic device 1J are integrally formed with radiating plate 6J.

In this embodiment, four fitting members 5J are disposed on opposite sides of rectangular radiating plate 6J such that two fitting members 5J on one side of radiating plate 6J are opposed to two fitting members 5J on the other side of radiating plate 6J. Each of fitting members 5J is constituted of base portion 5a and press-fit terminal 5g. Base portion 5a outwardly extends from the side periphery of radiating plate 6J. Press-fit terminal 5g uprightly extends from an outer end portion of base portion 5a. Press-fit terminal 5g is directly press-fit into through hole 4e' of circuit board 4 without extending through insulator 7J. Fitting members 5J is integrally formed with radiating plate 6J, for instance, by press working.

In the fourth embodiment, since fitting members 5J are integrally formed with radiating plate 6J, radiating plate 6J can be fixed to circuit board 4 without using base 2.

Further, in the fourth embodiment, since press-fit terminal 5g is press-fit into circuit board 4 bypassing insulator 7J, it is not necessary to form fitting holes for fitting members 5J in insulator 7J, thereby serving for simplifying the shape of insulator 7J.

[Fifth Embodiment]

Figure 20:
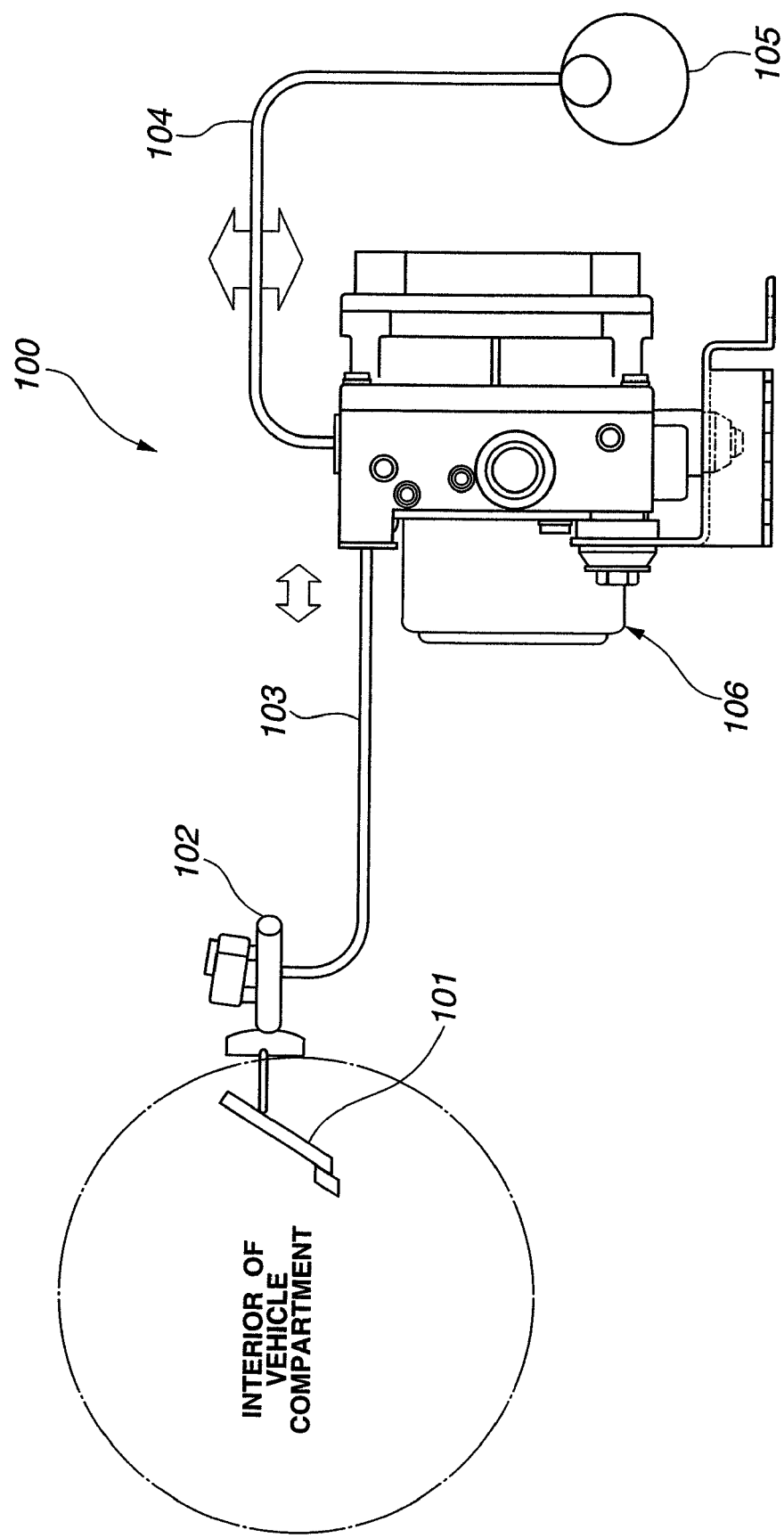
FIG. 20 is a system diagram showing a vehicular brake system according to a fifth embodiment of the present invention.
Figure 21:
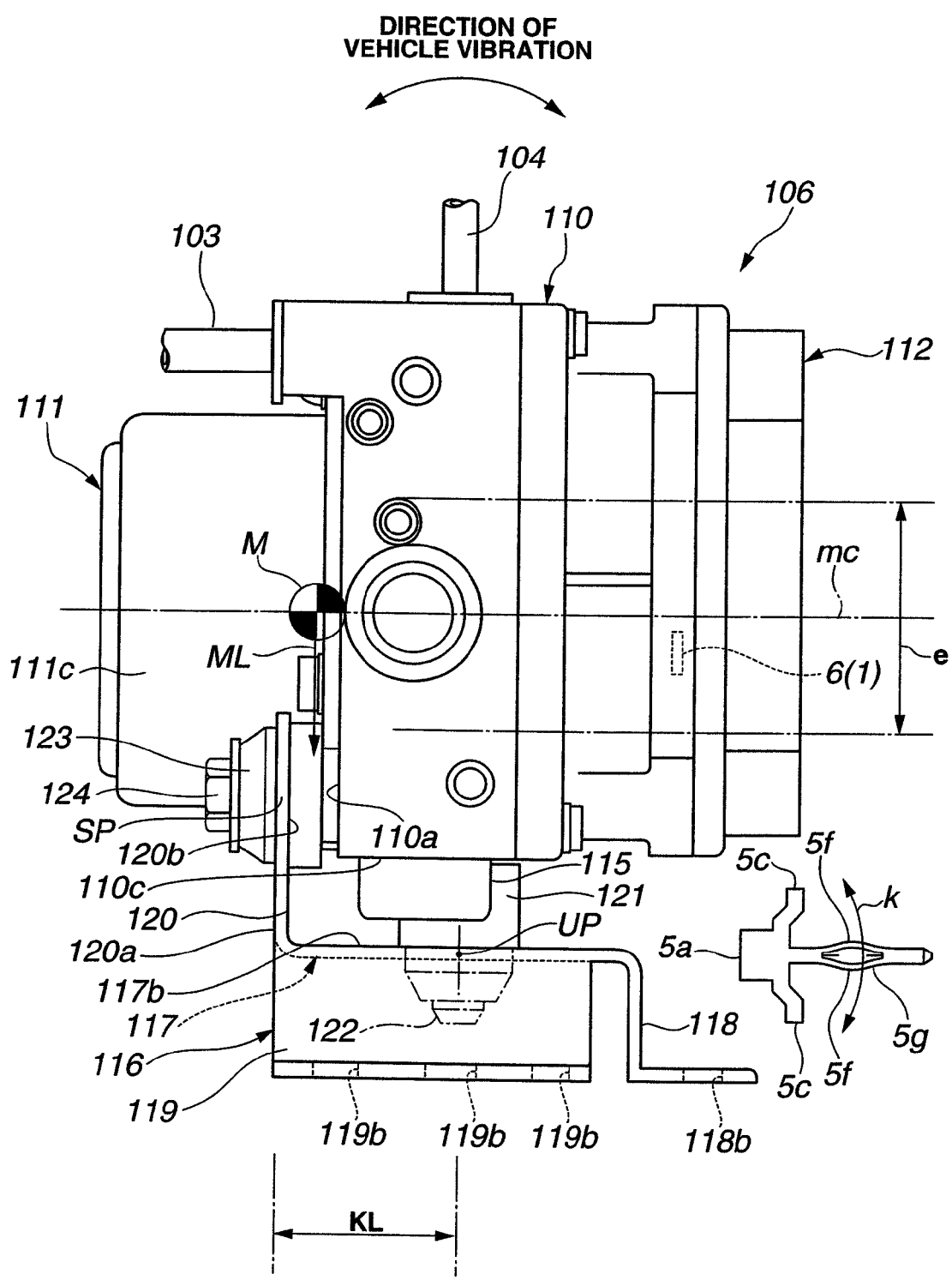
FIG. 21 is a side view of a hydraulic unit in the vehicular brake system according to the fifth embodiment of the present invention.
Figure 22:
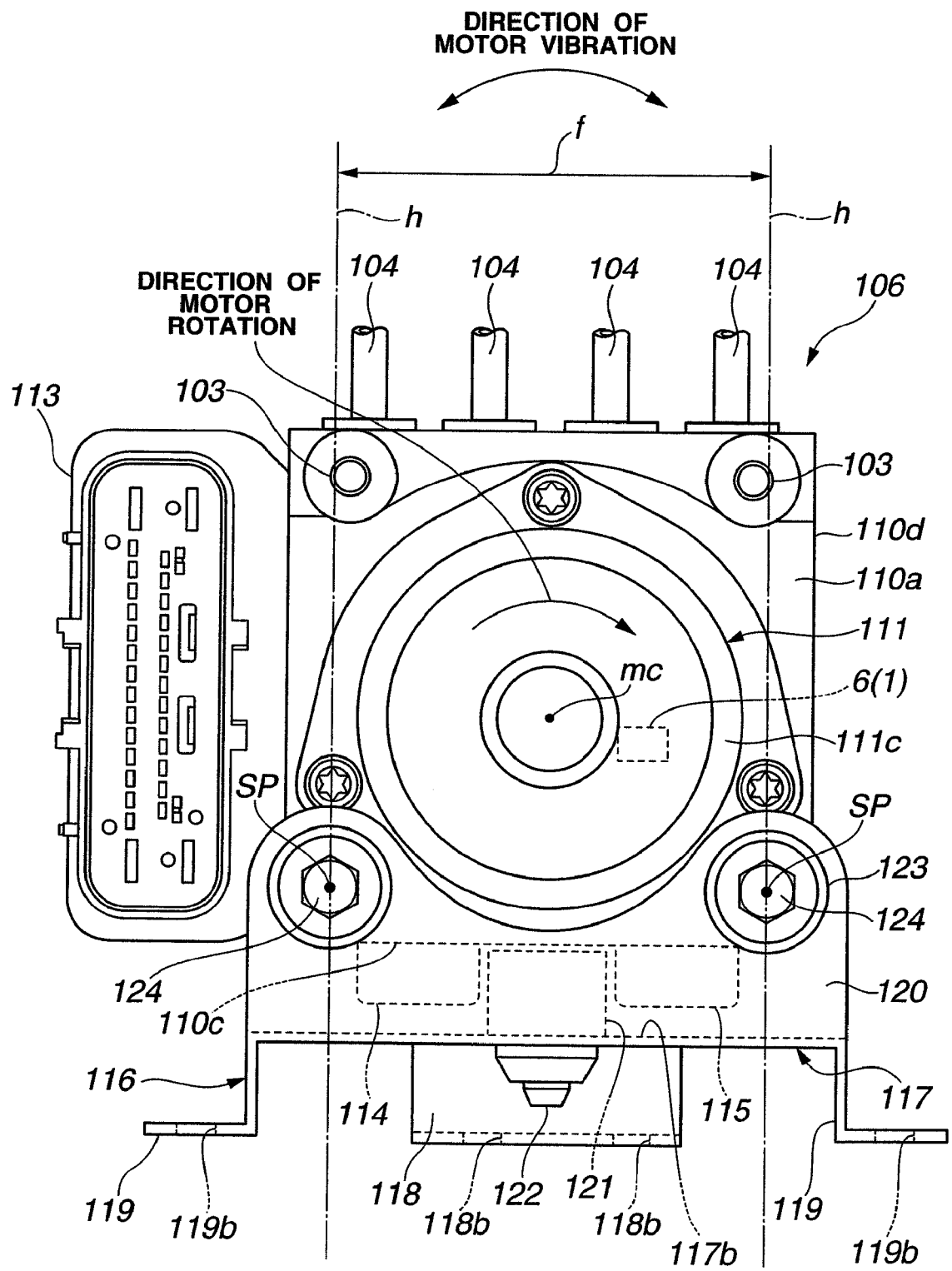
FIG. 22 is a front view of the hydraulic unit in the vehicular brake system according to the fifth embodiment of the present invention.

Referring to FIG. 20 to FIG. 22, a hydraulic unit according to a fifth embodiment of the present invention will be explained hereinafter. The hydraulic unit of the fifth embodiment is applied to a vehicular brake system. FIG. 20 is a system diagram showing a construction of the vehicular brake system in the fifth embodiment. FIG. 21 is a side view of the hydraulic unit, and FIG. 22 is a front view of the hydraulic unit. In FIG. 21, a left-and-right direction corresponds to a fore-and-aft direction of the vehicle.

As shown in FIG. 20, vehicular brake system 100 includes brake pedal 101 that is arranged within a vehicle compartment, master cylinder 102 that is connected to brake pedal 101, hydraulic unit 106 that is connected to master cylinder 102 via brake pipe 103, and wheel cylinder 105 that is connected to hydraulic unit 106 via brake pipe 104.

As shown in FIG. 21 and FIG. 22, hydraulic unit 106 includes housing 110 as a main body, motor 111 that is mounted to one end surface (i.e., a front surface) of housing 110, and casing 112 that is mounted to the other end surface (i.e., a rear surface) of housing 110.

Housing 110 includes a part of a brake circuit that connects master cylinder 102 and wheel cylinder 105, and a built-in plunger pump (not shown). That is, housing 110 is connected with brake pipes 103 connected to master cylinder 102 and brake pipes 104 connected to wheel cylinder 105, and has a built-in construction that includes the pump inside housing 110 so as to increase and decrease the wheel cylinder pressure.

Housing 110 has a plurality of openings which are formed on motor mounting surface 110a shown in FIG. 22 and an upper surface of housing 110. Brake pipes 103, 104 are connected to these openings of housing 110.

Motor 111 is operative to drive the plunger pump, and covered with motor casing 111c. Motor casing 111c is attached to housing 110 so as to cover motor 111 and also serve as a yoke.

Casing 112 accommodates an electromagnetic valve (not shown) and electronic device 1 explained in the first embodiment which controls operation of the electromagnetic valve and motor 111. Electronic device 1 can be replaced by electronic devices 1B, 1C, 1D, 1E, 1F, 1G, 1H and 1J explained in the modifications of the first embodiment and the second to fourth embodiments. As shown in FIG. 22, connector 113 is disposed on a side surface of casing 112. Electronic device 1 and motor 111 are supplied with electric power and signals via an external electric circuit that is connected to connector 113. Cylindrical reservoirs 114, 115 are disposed on lower surface 110c of housing 110.

Hydraulic unit 106 is secured to the vehicle body through bracket 116. Bracket 116 includes generally rectangular lower support bracket 117 that is opposed to a lower surface of housing 110, three leg brackets 118, 119, 119 and one lateral support bracket 120 which extend from lower support bracket 117, respectively. Leg brackets 118, 119, 119 downwardly extend from three sides of rectangular lower support bracket 117 and are contacted with the vehicle body, not shown. Lateral support bracket 120 upwardly extends from the remaining one side of rectangular lower support bracket 117 and is opposed to motor mounting surface 110a of housing 110. Leg brackets 118, 119, 119 are formed with bolt holes 118b, 119b, 119b into which bolts (not shown) are inserted.

As shown in FIG. 21, lower support bracket 117 has a bolt hole (not shown) located in lower support position UP. A central axis of the bolt hole which extends through lower support position UP in a vertical direction of hydraulic unit 106 is intersected with motor axis (i.e., central axis or rotation axis) mc of motor 111. Rubber vibration isolator 121 is fit into the bolt hole. Bolt 122 extends from below lower support bracket 117 through rubber vibration isolator 121 and is fastened to lower surface 110c of housing 110. Bolt 122 serves as a support shaft for hydraulic unit 106. Rubber vibration isolator 121 is interposed between lower support surface 117b (i.e., an upper surface of lower support bracket 117) and lower surface 110c of housing 110.

As shown in FIG. 22, lateral support bracket 120 has two bolt holes on left and right sides thereof. The bolt holes are formed in lateral support positions SP, into which rubber vibration isolators 123 as elastic members and bolts 124 are inserted. Rubber vibration isolators 123 are fit into the bolt holes, respectively. Bolts 124 are located such that axes thereof cross lateral support positions SP. Each of bolt 124 extends from the left side of each of rubber vibration isolators 123 through rubber vibration isolator 123 to the right side thereof as shown in FIG. 21, and is fastened to motor mounting surface 110a of housing 110. Bolt 124 serves as a support shaft for hydraulic unit 106. Rubber vibration isolator 123 includes a portion interposed between motor mounting surface 110a and one lateral support surface 120b of lateral support bracket 120 which is opposed to motor mounting surface 110a. Rubber vibration isolator 123 has a tip end portion that is elastically supported between the other lateral support surface 120a of lateral support bracket 120 and an end surface of a head of bolt 124.

In this embodiment, as shown in FIG. 21, center M of gravity of hydraulic unit 106 is located offset from a center of housing 110 and close to motor 111 due to the relatively heavy weight of motor 111. Gravity axis ML that extends from center M of gravity of hydraulic unit 106 in the direction of gravity is located within support width region KL which extends between lower support position UP and lateral support positions SP.

With the arrangement in which center M of gravity of hydraulic unit 106 is located within support width region KL between lower support position UP and lateral support positions SP, hydraulic unit 106 can be prevented from undergoing cantilever vibration that is caused in the conventional art when vibration is generated in hydraulic unit 106 due to the pump operation. Accordingly, it is possible to reduce the vibration in hydraulic unit 106 as compared to the conventional art and thereby suppress uncomfortable feeling of a vehicle driver and deterioration in the supporting rigidity of bolts 122, 124.

More specifically, in this embodiment, brake pipes 103, 104 are arranged apart from support positions SP, UP so as to be farther than center M of gravity of hydraulic unit 106 therefrom in the vertical direction of hydraulic unit 106. That is, the connections of brake pipes 103, 104 with housing 110 are arranged such that a distance from each of support positions SP, UP is larger than a distance between center M of gravity of hydraulic unit 106 and each of support positions SP, UP. If there occurs cantilever vibration in hydraulic unit 106, then brake pipes 103, 104 are caused to vibrate and brake pipes 103 are urged in an axial direction thereof. The vibration of brake pipes 103 may be transmitted to the vehicle driver's side (i.e., the vehicle compartment). However, in this embodiment, occurrence of the cantilever vibration in hydraulic unit 106 can be suppressed as described above, and therefore, the problem of vibration of brake pipes 103, 104 can be eliminated.

Further, in this embodiment, as shown in FIG. 21, radiating plate 6 of electronic device 1 is arranged within region e near motor axis mc of motor 111 which extends through a center of motor 111. Motor axis mc extends in a direction perpendicular to gravity axis ML that extends from center M of gravity of hydraulic unit 106 in the direction of gravity. Region e extends from motor axis mc in the vertical direction of hydraulic unit 106. Further, radiating plate 6 is arranged closer to bracket 116 than center M of gravity of hydraulic unit 106 in the vertical direction of hydraulic unit 106. Bolts 124, 124 serve as support portions which are fixed to the vehicle body through bracket 116. In addition, as shown in FIG. 22, radiating plate 6 is arranged within region f defined by lines h, h that extend through central axes of bolts 124, 124 substantially parallel to opposed side surfaces 110d of housing 110 and are spaced from each other in a lateral direction of hydraulic unit 106. Further, as shown in FIG. 21, radiating plate 6 is arranged closer to leg bracket 118 than motor axis mc in the vertical direction of hydraulic unit 106. In FIG. 21, fitting member 5 is schematically shown as disposed in a direction of fixing fitting member 5 to circuit board 4 within hydraulic unit 106. By thus fixing fitting member 5 to circuit board 4, press-fit terminal 5g of fitting member 5 can act to suppress vibration that is caused in circuit board 4 and radiating plate 6 in direction k shown in FIG. 21.

Particularly, plate spring portions 5f of press-fit terminal 5g are so arranged as to cross direction k of the vibration in circuit board 4 and radiating plate 6. With this arrangement, plate spring portions 5f can be resiliently deformed to absorb the vibration.

As explained above, in this embodiment, hydraulic unit 106 includes housing 110 that is connected with brake pipes 103 connected to master cylinder 102 and brake pipes 104 connected to wheel cylinder 105 and has a built-in construction including the pump so as to increase and decrease the wheel cylinder pressure. Hydraulic unit 106 further includes motor 111 that is mounted to one end surface (i.e., the front surface) of housing 110 and drives the pump, and electronic device 1 of the first embodiment which is mounted to the other end surface (i.e., the rear surface) of housing 110 and controls operation of motor 111. Radiating plate 6 of electronic device 1 is arranged in region e near line mc, i.e., motor axis mc of motor 111, extending perpendicular to an axis that extends from a center of gravity of hydraulic unit 106 along direction ML of gravity. Accordingly, center M of gravity of a whole body of hydraulic unit 106 including radiating plate 6 is located closer to the mounting position of hydraulic unit 106 relative to the vehicle body, so that vibration in electronic device 1 (radiating plate 6) can be suppressed.

Further, in this embodiment, hydraulic unit 106 is secured to the vehicle body through bracket 116, and radiating plate 6 is arranged closer to bracket 116 than center M of gravity of hydraulic unit 106 in the vertical direction of hydraulic unit 106. With this arrangement, center M of gravity of hydraulic unit 106 including radiating plate 6 is located closer to the mounting position of hydraulic unit 106 relative to the vehicle body, so that vibration in electronic device 1 (radiating plate 6) can be suppressed.

Further, in this embodiment, radiating plate 6 of electronic device 1 is arranged within region f defined by lines h, h that extend through the support portions, i.e., the axes of bolts 124, 124, and substantially parallel to opposed side surfaces 110d of housing 110 and are spaced from each other in the lateral direction of hydraulic unit 106. With this arrangement, center M of gravity of a whole body of hydraulic unit 106 including radiating plate 6 is located closer to the mounting position of hydraulic unit 106 relative to the vehicle body, so that vibration in electronic device 1 (radiating plate 6) can be suppressed.

Region f is not limited to the region defined by lines h, h extending through the axes of bolts 124, 124 (i.e., lateral support positions SP). Region f can be defined by contact portions between outer circumferential peripheries of rubber vibration isolators 123 and the bolt holes of lateral support bracket 120 (see FIG. 22).

Further, in this embodiment, radiating plate 6 is arranged closer to leg bracket 118 than motor axis mc (i.e., the center of motor 111) in the vertical direction of hydraulic unit 106. With this arrangement, center M of gravity of a whole body of hydraulic unit 106 including radiating plate 6 is located closer to the mounting position of hydraulic unit 106 relative to the vehicle body, so that vibration in electronic device 1 (radiating plate 6) can be suppressed.

Furthermore, as shown in FIG. 22, radiating plate 6 can be arranged between brake pipes 103 that are spaced from each other in the lateral direction of hydraulic unit 106. That is, radiating plate 6 can be disposed between connecting portions of brake pipes 103 at which brake pipes 103 are connected to housing 110. With this arrangement, vibration in the lateral direction of hydraulic unit 106 which is generated by motor 111 can be more effectively suppressed.

In a hydraulic unit of the conventional art, when vibration is generated in the hydraulic unit due to change in hydraulic pressure in the brake circuit which is caused upon controlling the motor operation and the wheel cylinder pressure, there may occur cantilever vibration (oscillating vibration) in the hydraulic unit depending on the position of center of gravity of the hydraulic unit. In such a case, the vibration is transmitted to the vehicle compartment through brake pipes and a master cylinder, thereby producing uncomfortable feeling of the vehicle driver. Also, in such a case, fixing bolts that fix a hydraulic actuator to the vehicle body are loosen due to the vibration, thereby causing deterioration in mounting rigidity of the hydraulic actuator.

In contrast, in this embodiment, since radiating plate 6 is arranged within hydraulic unit 106 as explained above, it is possible to suppress vibration in hydraulic unit 106. Further, even when vibration is generated in the hydraulic actuator due to occurrence of cantilever vibration in hydraulic unit 106, it is possible to prevent the vehicle driver from suffering from uncomfortable feeling and suppress deterioration in mounting rigidity of the hydraulic actuator.

The present invention is not limited to the above-described embodiments and modifications. The present invention can also be applied to electronic devices for various other control units, for instance, a power steering control unit and an automatic transmission (AT) control unit without limiting to the electronic device for the brake system as explained in the above embodiments.

Further, the circuit board is not limited to one that has a printed wiring on the surface as explained in the above embodiments. A circuit board having a printed wiring between layers thereof can be used.

Figure 23:
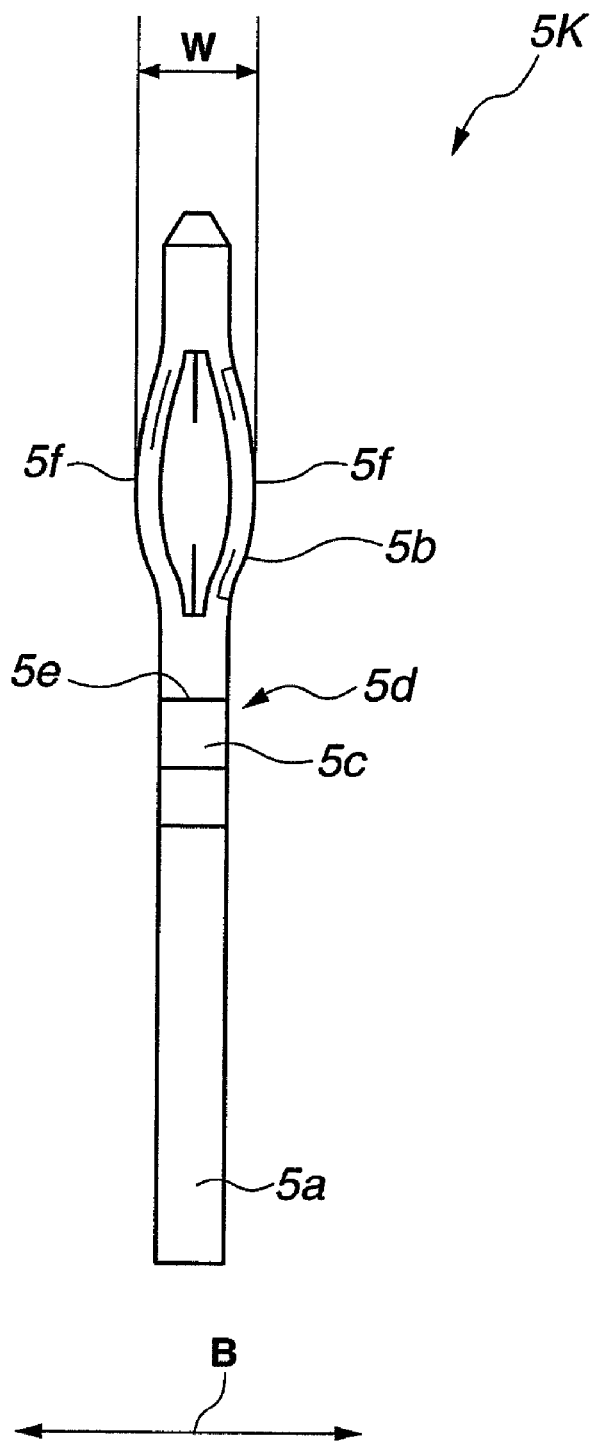
FIG. 23 is a front view of a fitting member of an electronic device according to a sixth embodiment of the present invention.
Figure 24:
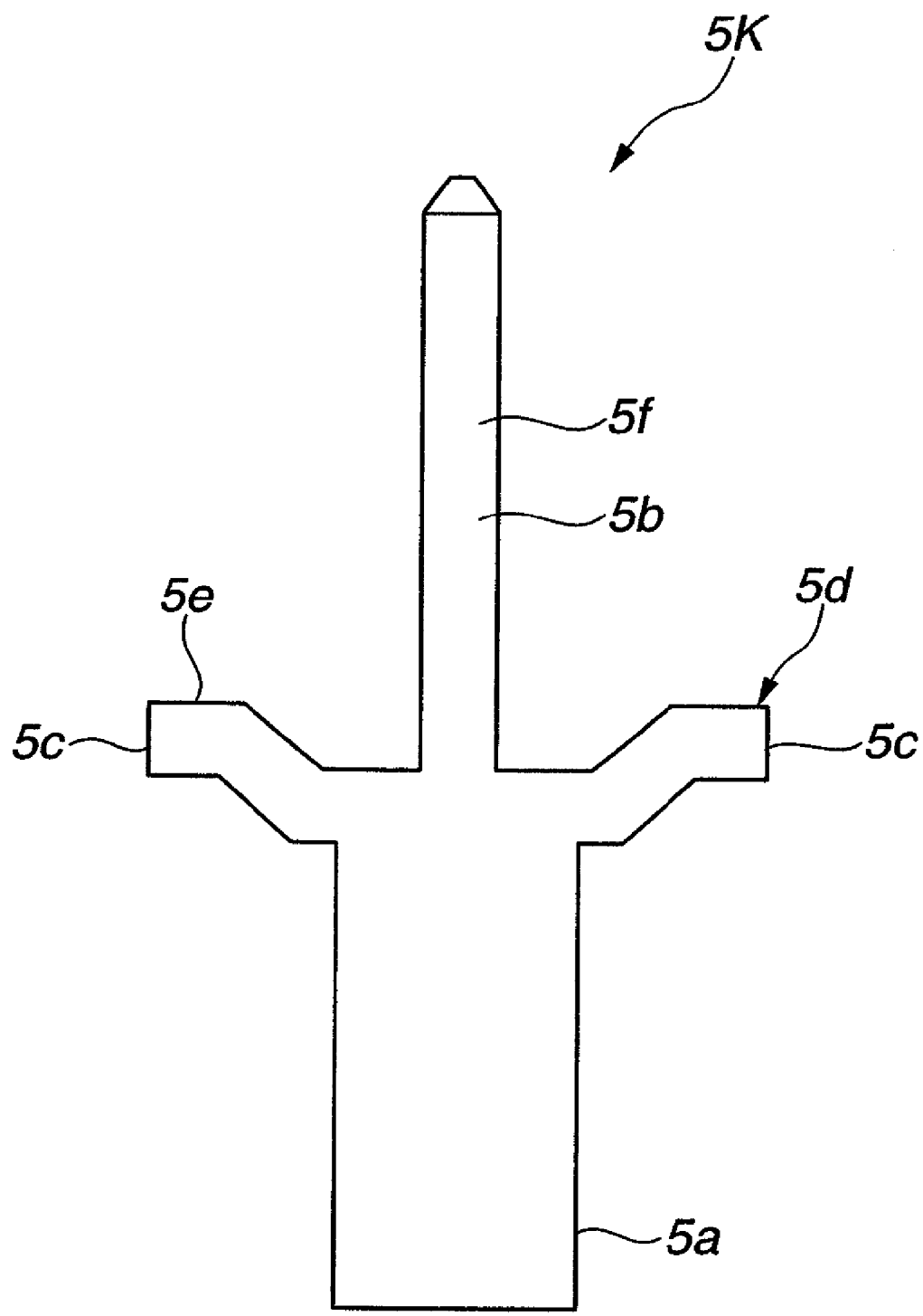
FIG. 24 is a side view of the fitting member shown in FIG. 23.

Further, the fitting member of the electronic device is not limited to one explained in the above embodiments. FIG. 23 and FIG. 24 shows fitting member 5K according to a six embodiment of the present invention. As shown in FIG. 23 and FIG. 24, fitting member 5K includes press portions 5c that extend from body portion 5a in a direction perpendicular to width direction B of press-fit portion 5b, that is, in a direction perpendicular to a direction of the resilient restoring force of press-fit portion 5b.

This application is based on a prior Japanese Patent Application No. 2008-088753 filed on Mar. 28, 2008. The entire contents of the Japanese Patent Application No. 2008-088753 are hereby incorporated by reference.

Although the invention has been described above by reference to certain embodiments of the invention and modifications of the embodiments, the invention is not limited to the embodiments and modifications described above. Further variations of the embodiments and modifications described above will occur to those skilled in the art in light of the above teachings. The scope of the invention is defined with reference to the following claims.

What is claimed is:

1. An electronic device comprising:
a circuit board onto which an electronic part is installed;
a radiating member; and
at least one fitting member made of metal that fixes the radiating member to the circuit board,
wherein the at least one fitting member is formed with a resilient portion that is configured to produce a resilient restoring force and holds the radiating member in a state fixed to the circuit board by the resilient restoring force,
wherein the circuit board is formed with a first fitting hole, the radiating member is formed with a second fitting hole that is communicated with the first fitting hole, and the fitting member includes a body portion and an insertion portion that extends from the body portion and is inserted into the first fitting hole and the second fitting hole,
wherein the resilient portion includes at least one press portion which extends from the body portion in a direction crossing an insertion direction of the insertion portion in which the insertion portion is inserted into the first fitting hole,
wherein the insertion portion is formed with a press-fit portion that is press-fit into the first fitting hole, and
wherein the first fitting hole is a through hole, the through hole being covered with a conductive plate on a circumferential surface of the through hole and arranged so as to allow electrical conduction between the electronic part and the insertion portion.

2. The electronic device as claimed in claim 1, wherein the circuit board is formed with a first fitting hole, the fitting member includes an insertion portion that is inserted into the first fitting hole, and the resilient portion includes a press-fit portion that is formed on the insertion portion and press-fit into the first fitting hole to thereby produce the resilient restoring force.

3. The electronic device as claimed in claim 2, wherein the radiating member is formed with a second fitting hole that is communicated with the first fitting hole, and the insertion portion is inserted into the first fitting hole and the second fitting hole.

4. The electronic device as claimed in claim 2, wherein the fitting member is integrally formed with the radiating member.

5. The electronic device as claimed in claim 1, wherein the through hole being arranged so as to allow heat transfer between the electronic part and the radiating member through the insertion portion.

6. The electronic device as claimed in claim 5, wherein the through hole is arranged in proximity of the electronic part.

7. A hydraulic unit comprising the electronic device according to claim 1, the hydraulic unit further comprising:
   a housing that is connected with brake pipes connected with a master cylinder and a wheel cylinder, respectively, and has a built-in construction including a pump so as to increase and decrease a wheel cylinder pressure; and
   a motor that is mounted to one end surface of the housing and drives the pump,
   wherein the electronic device is mounted to the other end surface of the housing and controls operation of the motor,
   wherein the radiating member of the electronic device is arranged near a line extending perpendicular to an axis that extends from a center of gravity of the hydraulic unit along a direction of gravity.

8. The hydraulic unit as claimed in claim 7, wherein the hydraulic unit is secured to a vehicle body through a bracket, and the radiating member is arranged closer to the bracket than the center of gravity of the hydraulic unit.

9. A hydraulic unit comprising the electronic device according to claim 1, the hydraulic unit further comprising:
   a housing that is connected with brake pipes connected with a master cylinder and a wheel cylinder, respectively, and has a built-in construction including a pump so as to increase and decrease a wheel cylinder pressure; and
   a motor that is mounted to one end surface of the housing and drives the pump; and
   support portions that are fixed to a vehicle body through a bracket,
   wherein the electronic device is mounted to the other end surface of the housing and controls operation of the motor,
   wherein the radiating member of the electronic device is arranged within a region defined by lines that extend through the support portions and substantially parallel to opposed side surfaces of the housing.

10. The hydraulic unit as claimed in claim 9, wherein the radiating member is arranged closer to the bracket than an axis of the motor.

11. The electronic device as claimed in claim 1, wherein when the press portion acts on the radiating member so as to bias a substantial center of gravity of the radiating member toward the circuit board.

12. The electronic device as claimed in claim 1, wherein the press portion comprises a plurality of press portions, the plurality of press portions extending from the body portion in directions different from each other and in an insertion direction of the insertion portion in which the insertion portion is inserted into the first fitting hole.

13. The electronic device as claimed in claim 1, wherein when the insertion portion is inserted into the first fitting hole, the press portion is brought into contact with the radiating member and resiliently deformed to press the radiating member toward the circuit board.

14. The electronic device as claimed in claim 1, wherein the insertion portion is a press-fit terminal, the press-fit terminal being press-fit into the first fitting hole and the second fitting hole to thereby produce the resilient restoring force, the press-fit terminal constituting a part of the resilient portion.

15. A method of fixing a radiating member to a circuit board in an electronic device, the method comprising the steps of:
   overlapping the radiating member and the circuit board such that a through hole formed in the circuit board is communicated with a fitting hole formed in the radiating member; and
   press-fitting a press-fit terminal formed on a fitting member made of metal into the through hole through the fitting hole until a center of resilient deformation of the press-fit terminal and a center of the through hole in a thickness direction of the circuit board are substantially aligned with each other, such that a resilient portion formed on the fitting member urges the radiating member toward the circuit board so as to support the radiating member between the resilient portion and the circuit board,
   wherein the fitting member includes a body portion and an insertion portion that extends from the body portion and is inserted into the through hole and the fitting hole,
   wherein the resilient portion includes at least one press portion which extends from the body portion in a direction crossing an insertion direction of the insertion portion in which the insertion portion is inserted into the through hole,
   wherein the insertion portion is formed with a press-fit portion that is press-fit into the through hole, and
   wherein the through hole is covered with a conductive plate on a circumferential surface of the through hole and arranged so as to allow electrical conduction between the electronic part and the insertion portion and heat transfer between the electronic part and the radiating member through the insertion portion.

16. The method as claimed in claim 15, wherein the radiating member is pressed and supported by a resilient portion formed on the press-fit terminal.

* * * * *